(12) United States Patent
Salazar et al.

(10) Patent No.: US 9,171,126 B1
(45) Date of Patent: Oct. 27, 2015

(54) RANGE PATTERN MATCHING IN MASK DATA

(71) Applicant: Synopsys, Inc., Mountain View, CA (US)

(72) Inventors: Daniel Salazar, Santiago (CL); John Valadez, Austin, TX (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/225,383

(22) Filed: Mar. 25, 2014

Related U.S. Application Data

(60) Provisional application No. 61/805,105, filed on Mar. 25, 2013, provisional application No. 61/912,669, filed on Dec. 6, 2013.

(51) Int. Cl.
*G06F 17/50* (2006.01)

(52) U.S. Cl.
CPC .................. *G06F 17/5081* (2013.01)

(58) Field of Classification Search
CPC ... G06K 9/6232; G06F 21/32; G06F 17/5072; G06F 17/5077
USPC ........................................ 716/50–55
See application file for complete search history.

(56) References Cited

U.S. PATENT DOCUMENTS

| | | | |
|---|---|---|---|
| 2004/0107412 A1* | 6/2004 | Pack et al. | 716/19 |
| 2005/0118514 A1* | 6/2005 | Tsai | 430/5 |
| 2012/0240086 A1* | 9/2012 | Song et al. | 716/53 |

* cited by examiner

*Primary Examiner* — Binh Tat
(74) *Attorney, Agent, or Firm* — Ardeshir Tabibi; Alston & Bird LLP

(57) ABSTRACT

Pattern matching technology is used to find locations in mask data that are available for later processes, such as marking. These locations are found using pattern definitions. A match algorithm outputs locations that match the pattern definitions. Each pattern definition may include multiple marks. The patterns can be symmetrical or asymmetrical and the marks can be correctly placed during a marking step by using orientation information determined during the pattern matching process. Large area geometries may be located by a two-step process that generates a pattern definition by defining smaller patterns therein and by defining the spatial relationships of the smaller patterns. An additional correlation step results in high accuracy while minimizing computing resources.

21 Claims, 17 Drawing Sheets

| | SIMILARITY | DISTANCE | RESULTING RANGE | MAIN USE |
|---|---|---|---|---|
| ABSOLUTE | 5 | 100 | 95 <= D <= 105 | EDGE SNAPPING |
| | 5 | 1000 | 995 <= D <= 1005 | |
| RELATIVE | 5 | 100 | 95 <= D <= 105 | OPC DEFORMATIONS |
| | 5 | 1000 | 950 <= D <= 1050 | |

FIG. 4

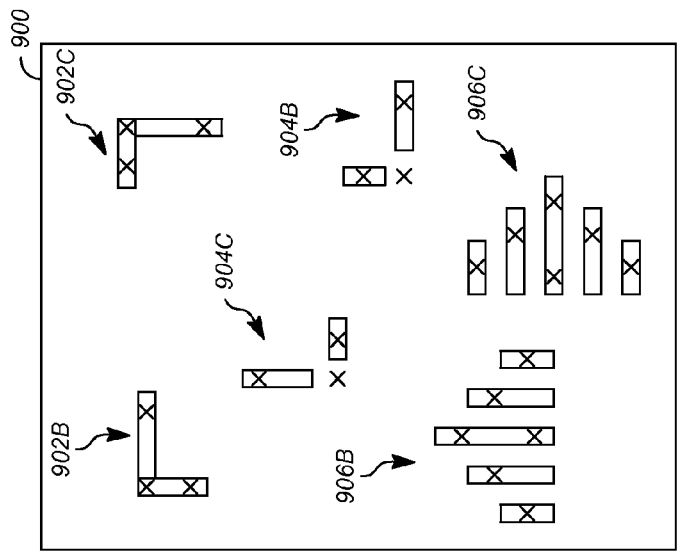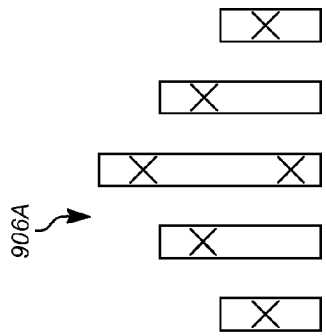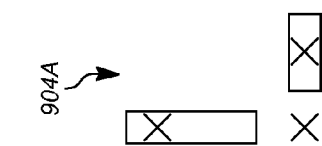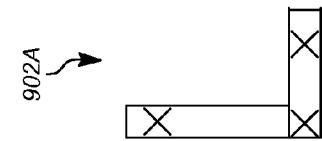
FIG. 9

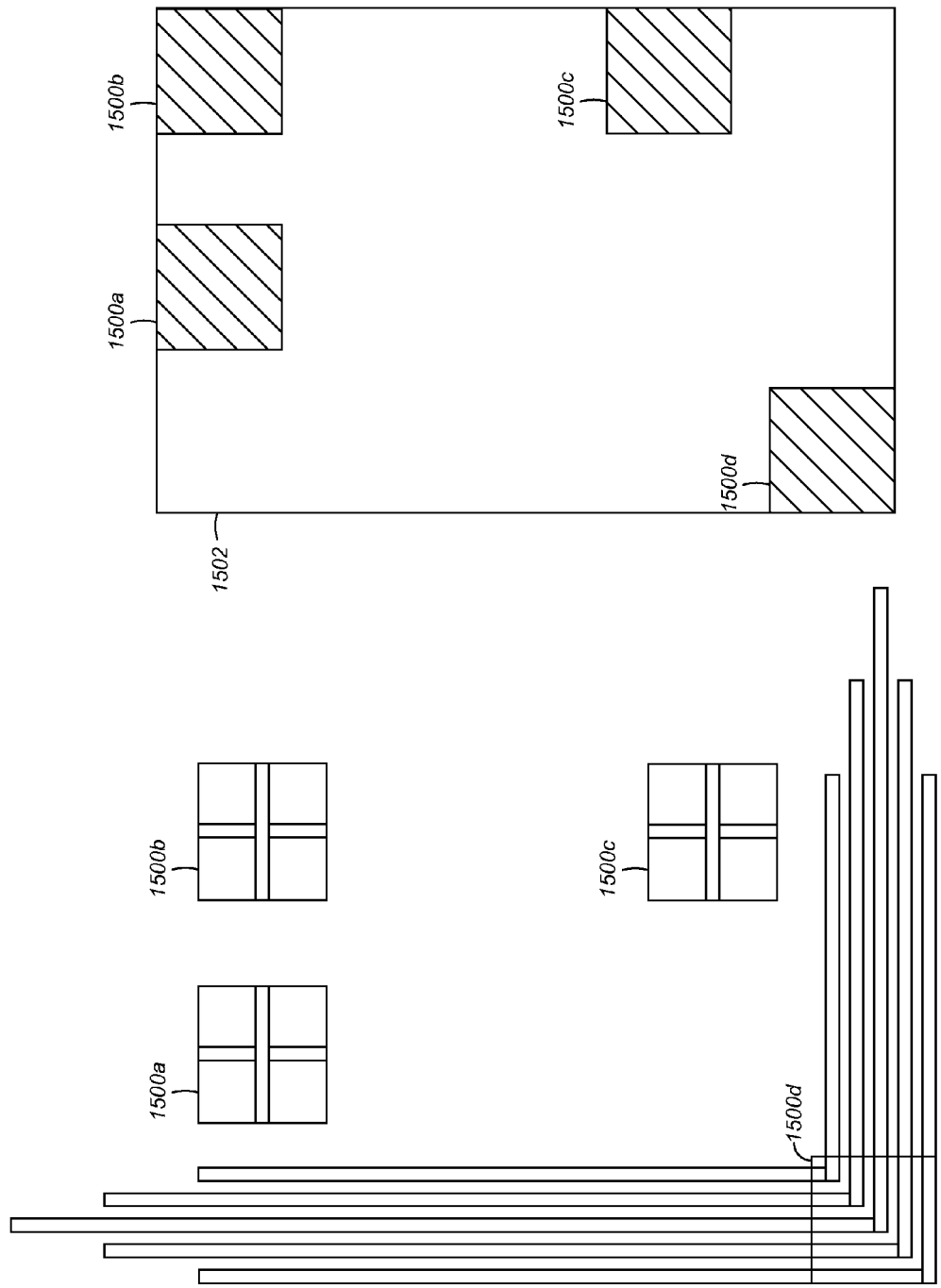

RANGE PATTERN MATCHING IN MASK DATA

CROSS-REFERENCES TO RELATED APPLICATIONS

This application claims priority to U.S. provisional patent application No. 61/805,105, filed Mar. 25, 2013, and to U.S. provisional patent application No. 61/912,669, filed Dec. 6, 2013, each of which is incorporated herein in its entirety by reference.

TECHNICAL FIELD

This disclosure relates in general to the fabrication of semiconductor chips and more specifically to matching patterns in mask data used in the layout of an integrated circuit (IC), such as for the placement of marks for printing on a semiconductor chip.

BACKGROUND

Semiconductor optical mask data preparation includes one or more processes that rely upon identifying features of interest in mask data. One such process may include, for example, placing marks at coordinates in mask data where a particular feature of interest needs to be measured. Given a description of a feature of interest, locations that fit the description may be found so that one or more marks may be placed on each such location. The marks can be translated into specially formatted metrology files used by optical tools or a critical dimension (CD) scanning electron microscope (SEM). For example, the marks may be used for in-process quality control in conjunction with one or more CDs to determine if a manufacturing process is correctly producing an IC. The term critical dimension refers to a size of a feature of a semiconductor that can be measured, in nanometers for example, that is related to the minimum feature size that can be created on that semiconductor wafer using a particular technology.

BRIEF SUMMARY

Disclosed embodiments describe techniques for pattern matching within mask data using symmetrical or asymmetrical patterns. The pattern matching may be used to define coordinates for the matched patterns for further processing. For example, marks, even multiple marks, may be identified within the matched pattern.

One apparatus described herein includes memory and a processor. The processor is configured to execute instructions stored in the memory to identify a match location in mask data that matches a pattern definition to the mask data, the pattern definition describing at least one geometric figure and having a pattern ID, identify a match orientation of the pattern definition within the match location, and generate a set of coordinates for the match location based on the pattern ID and the match orientation, the set of coordinates indicating a position in the mask data for further processing.

In another apparatus described herein, a processor is configured to execute instructions stored in memory to perform a first search of mask data for pattern definitions for each data clip of a plurality of geometry data clips, an output of the first search being a plurality of identified match locations, perform a second search of the mask data comparing the plurality of identified match locations to a spatial definition of a metapattern definition, the metapattern definition comprising at least two pattern definitions and the spatial definition between the at least two pattern definitions, wherein an output of the second search includes a match location in the mask data where the mask data matches the metapattern definition, and generate a set of coordinates for the match location, the set of coordinates indicating a position in the mask data for further processing.

Another implementation of the teachings herein is a non-transitory computer-readable storage medium storing instructions that, when executed by a processor, perform the steps of identifying a match location in mask data that matches a pattern definition to the mask data, the pattern definition describing at least one geometric figure and having a pattern ID, identifying a match orientation of the pattern definition within the match location, and generating a set of coordinates for the match location based on the pattern ID and the match orientation, the set of coordinates indicating a position in the mask data for further processing.

One method described herein includes performing a first search across a search area of mask data at a first resolution for pattern definitions of each data clip of a plurality of geometry data clips, an output of the first search being a plurality of match locations where the mask data matches one of the pattern definitions, and performing a second search across the search area of the mask data at a second resolution comparing the plurality of match locations to a spatial definition of a metapattern definition, wherein the metapattern definition comprises at least two pattern definitions and the spatial definition between the at least two pattern definitions, the second resolution is coarser than the first resolution, and an output of the second search is a candidate location for the metapattern definition. The method also includes correlating data of the candidate location with data of the at least two pattern definitions to determine whether the candidate location is a metapattern location for the metapattern definition.

Another method described herein includes identifying match locations across a search area of mask data that match a pattern definition describing a geometric figure associated with one or more marks, the pattern definition having a pattern ID, identifying match information including a match orientation of the geometric figure and the pattern ID for at least one identified match location, and generating a set of coordinates for placing each of the one or more marks at the at least one identified match location based on the match information.

Yet another apparatus described herein includes a processor configured to execute instructions stored in the memory to identify match locations across a search area of mask data that match a pattern definition describing a geometric figure associated with one or more marks, the pattern definition having a pattern ID, identify a match orientation of the geometric figure for at least one identified match location, and generate a set of coordinates for placing each of the one or more marks at the at least one identified match location based on the pattern ID and the match orientation.

Variations of these embodiments and other embodiments are described hereinafter

BRIEF DESCRIPTION OF THE DRAWINGS

The description herein makes reference to the accompanying drawings wherein like reference numerals refer to like parts throughout the several views, and wherein:

FIG. 4 is a table showing examples of absolute and relative similarity range functions;

FIG. 9 is a diagram of multiple marks on a series of asymmetrical features showing orientation matching in accordance with the teachings herein;

FIGS. 15A and 15B are diagrams illustrating a description of the metapattern formed by the large area geometry of FIG. 13;

DETAILED DESCRIPTION

Figure 1:
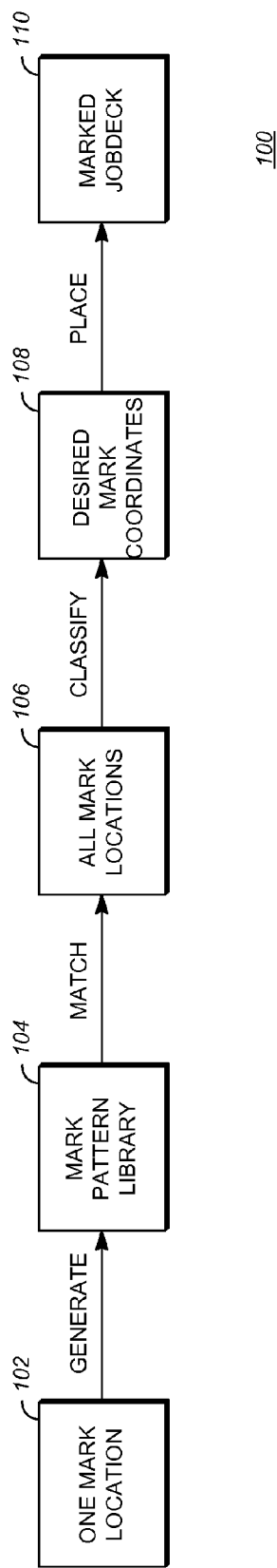
FIG. 1 is a diagram of a process for marking semiconductor masks in accordance with the teachings herein.

Pattern matching functionality has been used to find locations on a collection of mask data for various purposes, such as finding locations suitable for mark placements. These locations are found by first creating pattern definitions, or patterns. A pattern definition describes geometric features of interest in the mask data, which are descriptions of figures plus possible constraints such as distance ranges, name, identifier, etc. The patterns are passed to the pattern matching algorithm, which in turn outputs all found locations that match the description. One known system that performs such pattern matching functionality is the CATS® manufacturing rule checking and correction-range pattern matching (MRCC-RPM) system. CATS refers to a suite software product that transcribes complex design data into machine readable instructions for e-beam and laser machines used for the pattern generation and manufacturing of ICs, MEMS, TFT-LCD, TFH, photonics and biochip products available from Synopsys, Inc. of Mountain View, Calif. The teachings herein may be used in this product or in or with any other product that searches for patterns in mask data.

A mark template that includes at least one location for a mark relative to the pattern, once found, may be used. However, a mark template that can only hold one mark placed at its center and must be symmetrical is of limited use in advanced mask manufacturing where multiple desired marks and complex asymmetrical patterns exist. According to the teachings herein, mark templates that hold multiple marks at different offsets from a center, that hold multiple marks at offsets from an anchorpoint on the template and even hold marks of different types are described. According to the teachings herein, a mark template can contain pattern definitions, mark coordinates and mark options for each mark. Each template can be symmetrical or asymmetrical, and yet all the marks on it can still be correctly placed by taking advantage of match information during a place step, where the final mark coordinates are calculated using each location and its corresponding template. Placement of other mark types beyond basic ones is also explored, such as marks having an arbitrary area. An enhancement process can manage the use of chip/mark information by making use of the output of range pattern matching (RPM) by chip in order to reduce redundant chips processing, rather than search all chip placements by extension.

In the techniques described herein, pattern generation is enhanced to allow distributed generation, which allows a large number of pattern definitions to be created in one pass or processing step, even if they are spread from each other or near dense data. Additionally, global range values can be specified with the pattern descriptions, which allow for similar-yet-not-exact geometries to be found and marked.

In addition, and in order to generalize pattern definitions to include asymmetrical geometries, pattern match orientation information is obtained from a search step and is used during a classification process. Because the match orientation information is available, marks can be placed off-center on each location. In addition, multiple marks of different types can be placed, and their relative positions to the underlying geometrical features maintained even for locations that are rotated or mirrored. Other mark types beyond basic symmetrical, such as L-bar, 2-line and Arbitrary Area, are also employed, and the concept of arbitrary geometry marking is used.

Techniques for matching both large area and small area geometries (or shapes) are described that do not require excessive computational power, i.e., they do not require supercomputers. The techniques can be run in currently available standard machines programmed to operate according to the teachings herein. The approaches to range pattern matching, and optionally marking, described herein are deterministic, automated and robust against user errors.

The teachings herein are initially described with reference to FIG. 1, which is a flowchart diagram of a process 100 for marking semiconductor masks in accordance with the teachings herein. This is also called jobdeck marking herein. The term jobdeck refers to a collection of mask data that can be used in the creation of optical masks for use in semiconductor manufacturing. Jobdecks can be arranged in layers corresponding to each optical mask. Steps include identifying at least one mark location 102, generating pattern descriptions for the identified marks forming a mark pattern library 104, searching the one or more layers of the jobdeck using the pattern descriptions to identify mark locations in the jobdeck 106, classifying the desired mark coordinates 108 and marking the jobdeck by placing the classified desired marks in the jobdeck 100. These steps are described in more detail below by grouping the steps into: 1) pattern generation that describes each mark to be placed; 2) pattern matching that finds all locations and orientations of each mark type; 3) classification that reorders the location and orientation information to obtain placement coordinates; and 4) mark placement that transforms the template mark coordinates using the obtained coordinates.

Pattern Generation

In the context of this work, a pattern is a description of a feature of interest. For geometric data, a pattern is a description of a set of geometric figures. An exact pattern is a pattern that completely describes a particular set of figures, and only that set of figures, without possibility of simultaneously describing a different one.

In practical terms, an implementation of a pattern results in a pattern definition. A pattern definition may be held in a text file, binary file or other appropriate file format, and the definition implements specific syntax to describe distances between pairs of rectangle edges. Such a file may be created by processing a group of figures, usually in a specified window of a layout or jobdeck. In other words, a bounding box that surrounds a group of figures in a jobdeck or layout file results in a pattern definition file. This is called exact pattern generation.

Figure 6:
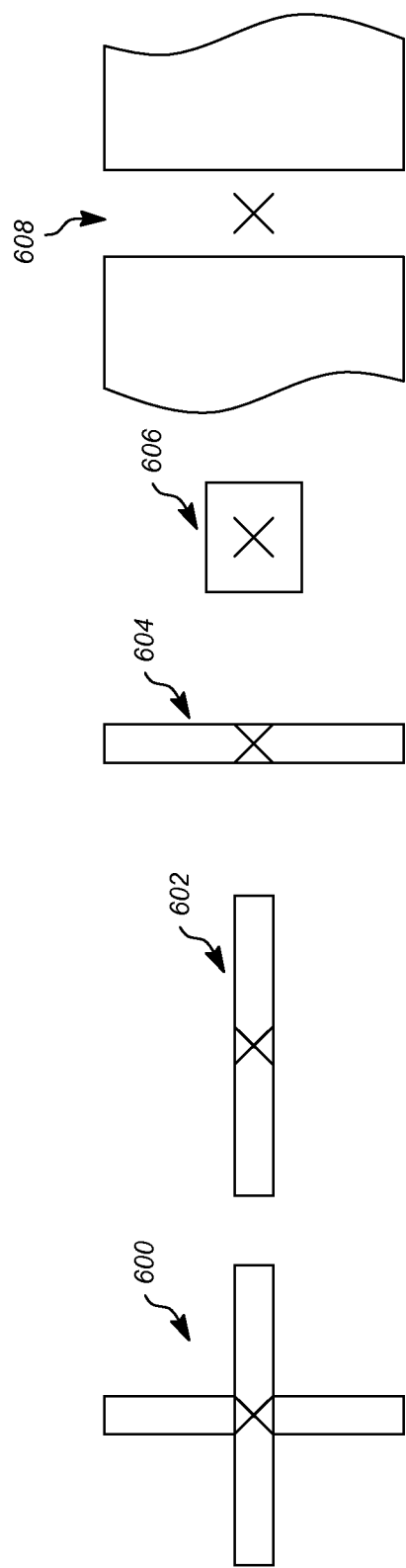
FIG. 6 is a series of diagrams showing symmetrical marks that can be used in accordance with the teachings herein.

FIG. 6 is a series of diagrams showing symmetrical marks that can be used in accordance with the teachings herein for symmetrical mask data polygons. Example exact patterns for five basic axis-symmetrical marks are shown, namely marks for an isolated solid cross 600, an isolated solid horizontal bar 602, and isolated solid vertical bar 604, and isolated solid box 606, and a reversed critical dimension (CD) 608.

The solid patterns are specified as isolated, which means nothing else can be within the bounding box of the set of figures, and nothing can be touching the figures from outside the pattern. The reversed CD is defined as not isolated, which means it is a space of defined distances between solid figures, and other figures may or may not be surrounding it.

A range pattern could be an exact pattern with added flexibility or restrictions for several variables, including but not limited to, distances between figure edges, don't care regions, boundary specifications, boundary types and pattern direction.

In this way, a single range pattern could describe several similar sets of figures, as long as each set meets the range constraints on the distances between figure edges. Boundary constraints can also be added to define which edges are anchored to the pattern limits. Boundary types define whether figure edges can have other figures touching from the outside or not. To fully describe some complex features of interest, more than one pattern definition is required, and this is where pattern libraries are useful. A pattern library is a collection of pattern definitions, for example within a file. For example, a pattern library may be contained within a single file or a collection of files. A range pattern library may be obtained by first generating a pattern library that contains an exact pattern definition, and then adding constraints to the exact pattern definition to form other pattern in the library. More desirably, however, a range pattern is an exact pattern plus a global tolerance (also called a global similarity) as discussed in more detail below.

Describing a geometrical feature of interest is accomplished creating a pattern definition from a geometrical data clip (also called a geometry data clip herein). A geometry data clip includes (e.g., polygon) data extracted from mask data within a limited area, which can be a rectangle, for example. This process can be trivial for small numbers of pattern definitions, such as the axis-symmetrical mark types described above, but the processing time and amount of surrounding data can profoundly affect performance for larger numbers of pattern definitions.

The creation of a pattern definition dictates that all geometry be available. It follows from this that, when processing data by block, all the geometry must be contained, or at least be visible, from the block that will generate the pattern definition. Blocks are defined as rectangular areas of a mask layer that can be processed as a unit.

One possible way to create a pattern library is to find one location of the required set of figures, cut the data out at the location and pass the resulting figures to the pattern generator. The resulting pattern library contains one pattern definition, which is an exact pattern that precisely describes the figures given it. Constraints can then be added as required. This is viable for sparse data or when the geometries are very close to each other, neither of which occurs often in actual usage scenarios. Another way is to directly create the pattern definition file from scratch based on a description of the required feature, such as a screenshot or written specification. This is difficult to do, since it requires knowledge of the pattern description syntax. Instead, it is easier to create a set of figures based on the description, and then proceed as in the previous case by passing the figures to the pattern generator.

This can be explained by reference to the five pattern types of FIG. 6 assuming the coordinates of at least one location is known for each type. A preprocessing step involves cutting out the set of figures for each type by using the known location within the mask data to be processed. This may be accomplished by copying the figures within the bounding box of the set of figures known for each type. Then, pattern generation is done by passing the five sets of figures to five generation commands. The result can include, for example, five pattern libraries, each with an exact pattern definition for one of the five mark types. As another example, the result can include five different commands in a single pattern library. The pattern definitions already describe the tone of the pattern, so no additional processing need be done regarding tone. However, if tone invariance were desired, it could be achieved by adding a pattern definition created from a set of figures with reversed tone, and adding that second pattern definition to the pattern library. The pattern library would then describe a feature of interest that may or may not be tone reversed.

A final, post-processing step adds constraints to the generated pattern definitions. Table 1 below shows the constraints that may be used for each of the five example geometries to be marked. Other geometrical shapes could apply.

TABLE 1

| Mask data type | Boundary specification | Boundary type | Direction |
| --- | --- | --- | --- |
| Cross | Boundary anchored for:<br>top edge of top rectangle<br>bottom edge of bottom rectangle<br>left edge of middle rectangle<br>right edge of middle rectangle | Strict boundary for:<br>top edge of top rectangle<br>bottom edge of bottom rectangle<br>left edge of middle rectangle<br>right edge of middle rectangle | Non-rotated |

TABLE 1-continued

| Mask data type | Boundary specification | Boundary type | Direction |
|---|---|---|---|
| Hbar | Boundary anchored for all 4 edges | Strict boundary for all 4 edges | Non-rotated |
| Vbar | Boundary anchored for all 4 edges | Strict boundary for all 4 edges | Non-rotated |
| Box | Boundary anchored for all 4 edges | Strict boundary for all 4 edges | Non-rotated |
| CD | Boundary anchored at bottom left | None | Invariant |

The technique above assumes the coordinates of at least one location is known for each type. In the absence of such knowledge, another option is to specify a block size that is large enough to contain all the geometries that will be described. This option is viable for very sparse data or when the geometries are very close to each other, neither of which occurs often in realistic usage scenarios. The second is to implement a processing loop where, in each iteration, a geometry clip is cut out, preprocessed if required, and then converted to a pattern definition. This works for geometries that are arbitrarily placed across the entire jobdeck, and the data density in between is rather irrelevant.

Another issue with the above technique is that that pattern definition is covered for only exact patterns, with an assumption that any distance edges could be added post-generation by editing the pattern definition manually. This has proven to be error prone and is in general not desirable.

For these reasons, a more generalized technique of pattern generation is desirable. First, if a large number of pattern definitions is to be created, where data density in surrounding areas can be high, and the patterns are spread across large areas, distributed processing is desirable. However, this means that data is processed concurrently by block, or by groups of blocks. As stated before, all geometry for which a pattern definition is to be created must be contained, or at least be visible, within a single data block. In order to meet this requirement, the concept of a geometry owning block is introduced.

Figure 2:
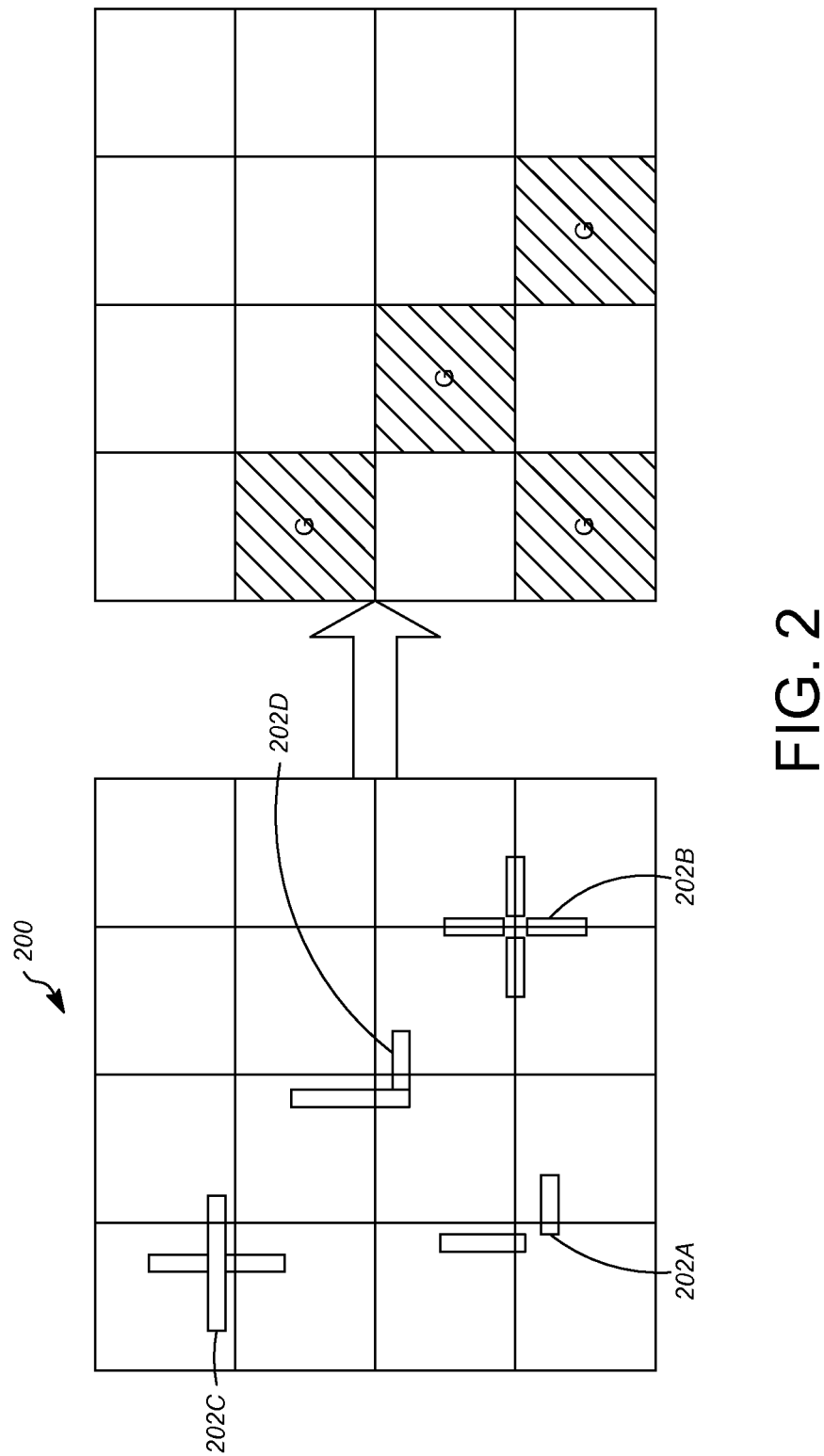
FIG. 2 is a diagram that illustrates the concept of a geometry owning block for distributed pattern generation in accordance with the teachings herein.

FIG. 2 is a diagram that illustrates the concept of a geometry owning block for distributed pattern generation in accordance with the teachings herein. FIG. 2 shows a region 200 of mask data 202A-202D and separately shows the owning blocks G for region 200. The owning block G can be that block that contains the center of the bounding box of the geometry to be described. It is this block, and only this block, that proceeds to generate the pattern definition. Thus, the result of defining the owning block is that only specific data blocks will create pattern definition files, while the rest will merely be skipped. One block can create many pattern definitions, or only one, or even none, depending on where the geometry clips are located in the mask data. However, no two blocks will generate the same pattern definition. Because each block handles its own patterns, the geometry generation process can be distributed, and large numbers of pattern definitions can be handled in scalable processing time.

This generalized process so far is an exact generation process to generate pattern definitions that describe geometrical features of interest. As explained above, in order to achieve ranged patterns, an assumption was made that the pattern definition could be manually edited to allow for specific ranges applied to specific distances in the pattern description. While this assumption is valid, it is impractical when applied to ranges that are meant to include geometries that are considered similar to the original. Therefore, a mechanism for automatic ranges is desirable. This automatic range generation is called a global similarity range or global tolerance herein and describes geometries that are similar to the original. This is the basis for automatic ranged pattern generation, also called tolerant-pattern generation or similar-pattern generation.

Figure 3:
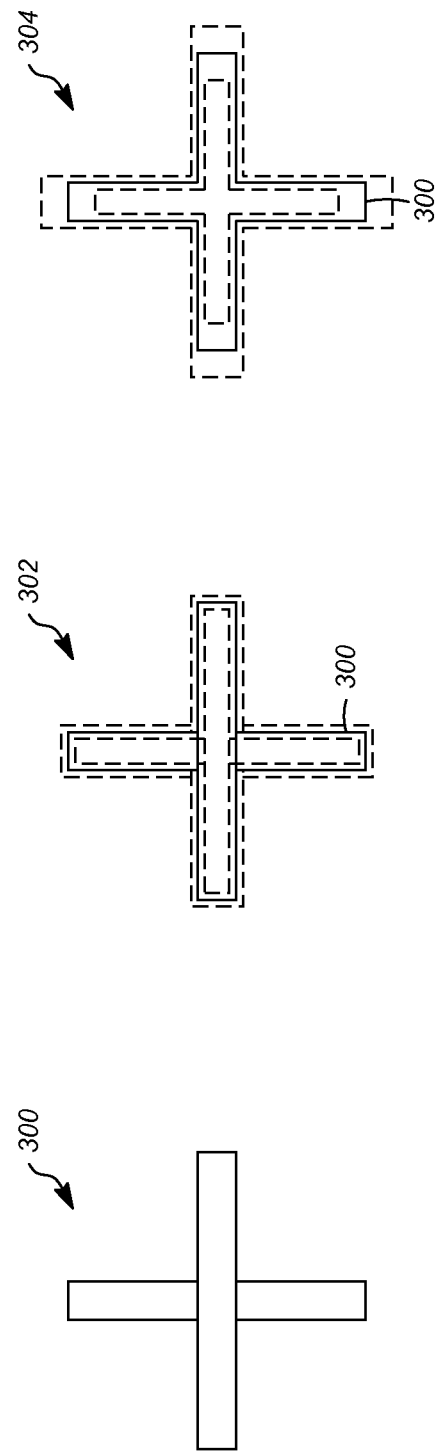
FIG. 3 is a diagram comparing global absolute and relative similarity for an original mark geometry.

There are two types of similarity that may be used to generate a ranged pattern, absolute and relative. FIG. 3 is a diagram comparing absolute similarity and relative similarity for an original geometry 300 of the mask data. As shown by the ranged geometry 302, absolute similarity means that the similarity range, represented by the dotted lines, applied to the geometry 300 is of fixed size, and therefore does not depend on the distances within the geometry 300 relative to an edge. This is most useful when looking for geometries that might have suffered from data snapping or rounding truncation during data processing, and could have edges that have been slightly moved. Relative similarity means that the similarity range is relative to the distance that it is applied to. Consequently, the longer the distance within between edges within the geometry 300, the larger the range that the edges can be from each other in the ranged geometry 304. Ranged geometry 304 shows these ranges in dotted lines. Relative similarity is useful when dealing with data that has been treated with optical proximity correction (OPC), and has therefore been drastically altered.

FIG. 4 is a table showing examples of absolute and relative similarity range functions. In either case, a similarity value (for example, a value of five) is applied when generating the pattern definitions, and is included in the distributed generation process, along with any other geometry pre-processing required. Using these functions, range patterns may be defined during pattern generation automatically. In an exact pattern, the distance D between two edges in a pattern definition is set to a fixed value. For example, a rectangle with a width of 30 and a height of 100 would result in an exact pattern of Range left to Range right between Dmin=30 and Dmax=30 and a Range bottom to Range top between Dmin=100 and Dmax=100.

In a range pattern, a range is applied to the distances between edge pairs, so that each distance becomes a range. For example, a range pattern for the rectangle above with a global absolute similarity of five (5) would have a dimension for Range left to Range right between Dmin=25 and Dmax=35 and a Range bottom to Range top between Dmin=95 and Dmax=105. The same similarity value is applied to form the range pattern for edge pairs in other shapes also. For example, where the rectangle is instead a polygon with a height that changes from 100 to 1000, the range about the more distant pairs of edges would be between Dmin=995 and Dmax=1005, even though the distance of 1000 is ten times greater than the distance of 100. In contrast, a range pattern for a rectangle with a width of 100 and a height of 1000 with a global relative similarity of five (5) could have a dimension for Range left to Range right between Dmin=95 and Dmax=105 and a Range bottom to Range top between Dmin=920 and Dmax=1050. The range for the height is ten times that of the width as the height is ten times that of the width. Note that the units of distance are not critical and so are not mentioned in these examples.

Figure 5:
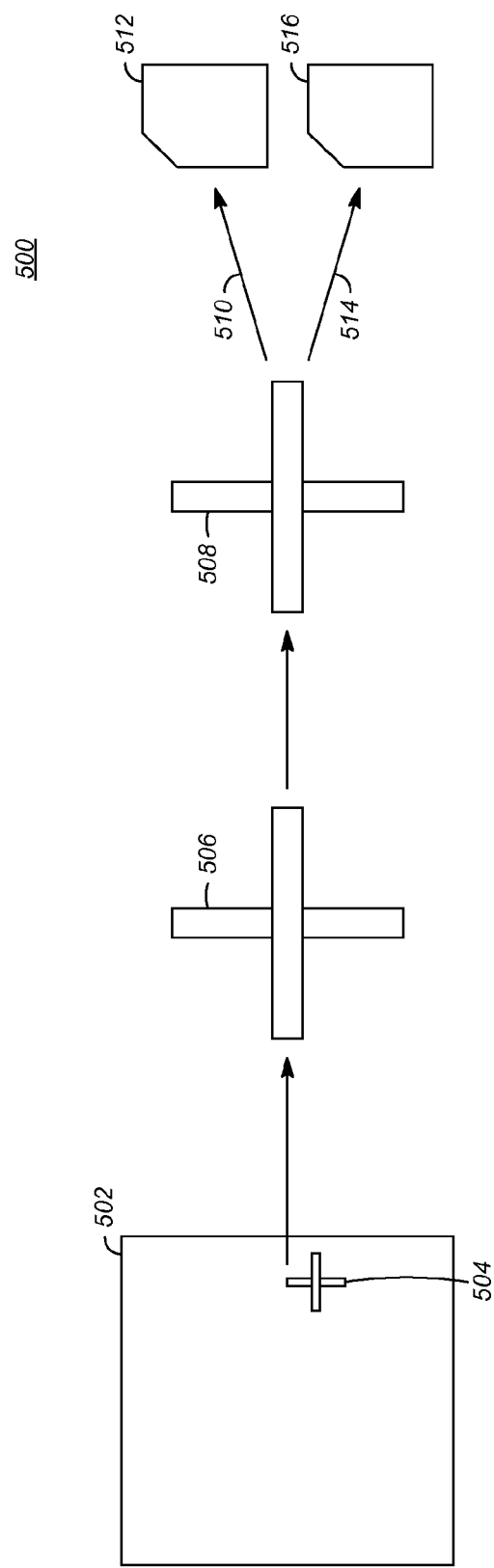
FIG. 5 is a diagram showing a process or generating pattern definitions with pre-processing and with or without a similarity range in accordance with the teachings herein.

FIG. 5 is a diagram summarizing a process 500 of generating pattern definitions with pre-processing and with or without a similarity range in accordance with one implementation of the teachings above. One layer 502 of a jobdeck including a geometric figure or feature 504 of mask data (also called a geometry herein) is used by example. Geometry 504 is cut out to form a geometry clip 506 in association with its owning block. Geometry clip 506 may be subjected to rule-based preprocessing to generate a preprocessed geometry clip 508 for input into automatic range generation for inclusion in pattern libraries. In FIG. 5, preprocessed geometry clip 508 is processed without a similarity range 510 to form a cross pattern 512 in an exact pattern library. Preprocessed geometry clip 508 is also processed with a similarity range 514 to form one or more cross patterns 516 in a ranged pattern library. In this way, a geometric feature can result in both an exact pattern and one or more ranged patterns for respective pattern libraries.

Pattern Matching

The pattern matching process occurs after pattern generation/definition. Range pattern matching (RPM) is the system by which pattern definitions are used to find similar groups of figures across an entire layout or jobdeck. The match algorithm uses the pattern definitions given it to check for description compliance over the design data, and wherever a match is found, a marker may be output or other processing may be performed that requires the location of patterns in mask data. Locations may be specified as coordinates in an X- and Y-axis coordinate space where the X axis is orthogonal to the Y-axis such as shown in FIG. 2. The matching system implements mirror invariance, controllable rotation invariance, a combination of mirror invariance and controllable rotation invariance, or no variance in the original pattern definition. The implementation of mirror invariance and controllable rotation invariance means that a pattern can be matched left to right in four orientations, top to bottom in four orientations, or all eight orientations (see FIG. 7). Different computer-implemented techniques to match patterns may be used, so this discussion is not limited to any particular technique.

When a goal is to place marks on the found geometry, and the geometry in general terms could be rotated or mirrored, the orientation of fully symmetrical features/marks may be irrelevant, and a mark can be placed at its center. In such an approach, the geometry must be the mark. For example, in order to place a mark of type cross, the geometry to search for must actually be a cross, so that the mark can be placed at the location center.

Symmetrical geometries, while useful, do not cover the full range of usage scenarios, and are therefore too simplistic for some applications. Asymmetrical marks are therefore also desirable to cover certain mark shapes. The range pattern matching process can search for Manhattan geometries of any shape. Therefore, searching for asymmetrical mark shapes falls naturally into its capabilities. Note that Manhattan geometries refers generally to the data structures that approximate mask design data and result from fracturing the mask design data into geometric shapes (e.g., rectangles) capable of being written by a mask writer.

Before pattern matching, a preprocessing step may be performed to remove non-rectilinear data since the teachings herein generally relate to mark types that are rectilinear. However, the data used herein is not limited to rectilinear data, so this preprocessing step is optional. Whether or not this preprocessing step is performed, the match process is next performed using respective commands associated with a pattern in each pattern library. Each pattern match command may process any jobdeck layer or layers. In such a case, several jobdeck layers can be processed (e.g., for marking) in one processing run, without requiring storage of intermediate results. The output of the match algorithm is geometric data for each match location.

Figure 7:
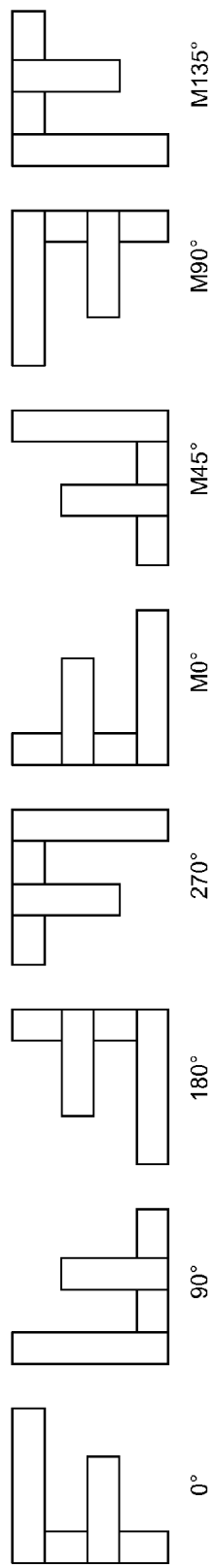
FIG. 7 is a series of diagrams showing orientations at which an asymmetrical feature of interest can be matched.

In contrast to symmetrical marks, when an asymmetrical feature of interest is searched for, the match orientation is no longer irrelevant. This is particularly true since the mark position for asymmetrical marks is seldom at the geometrical center. Since the matching process is orientation-invariant, each matched location may have been found at one or more of eight orientations. FIG. 7 is a series of diagrams showing orientations at which an asymmetrical feature of interest can be matched. Each orientation is labeled relative to an arbitrary orientation designated at 0 degrees for the unique pattern. As can be seen from FIG. 7, a label M is provided to indicate that the unique pattern has been mirrored. This matching process handles several pattern definitions simultaneously. Therefore, at each match location the ID of the matching pattern is also collected. The combination of pattern ID and match orientation is what is known as match information. This match information is attached to each match location so as to be later passed to the classification step/process described below.

In certain situations, the output of the match algorithm may include geometric data with a bounding box placed over each mark location found in the input jobdeck. In such a case, a postprocessing step of filtering out overlapped figures may be included. Overlapped bounding boxes output by the match processing mean matches that are too close together. While it is possible to handle such cases, they are generally undesired, and therefore may be filtered to be handled elsewhere (e.g., in a manual process).

Regardless of whether filtering is performed, a postprocessing step can occur to output the match result information in a format that is fit for the next step in the solution, which is classification. This can include placing the mark locations found on a specific jobdeck layer on the same layer in the output in order to maintain consistency. In this way, the layer information is maintained. This post processing may also place, in some implementations, mark locations on different datatypes depending on the template, to differentiate marks from different templates. Due to the post processing, the datatype information of the output represents all locations found for a particular mark type across the entire jobdeck.

Classification

The classification step/process takes the list of match locations, processes them with a selected method, and restructures the match locations. For small area geometries, the match locations are reordered and reduced. For large area geometries, a pre-processing correlation is done, where the match information is used to remove false positives of the metamatch results. The locations that remain after the correlation are reordered and reduced in the same way as for the small area geometries. Small and large geometries are discussed in additional detail below.

In either case, reduction can be done with several different methods, examples of which include: random reduction, where locations are removed by random picking; uniform reduction, wherein locations are removed with the goal of maintaining a uniform location density across the jobdeck area; and weighted reduction, where a density function is used to make removal of locations more likely in some areas and less likely in others, such as thinner in the center or denser around edges. It is not required to place marks at all locations found, so the list may be thinned down. However, it is not enough to just choose among the entire list, since a different number of placements is required for each template. Therefore, classification is a process in which the output data is restructured according to predefined criteria and thinned down to desired numbers according to the types and number of marks to be placed. In the teachings herein, the classification process involves the following steps:

1. Reduction of locations; and
2. Sorting of remaining locations based on jobdeck layer and matched pattern ID.

Because the match locations can include asymmetrical geometries, the match orientation information is used in this process. In addition, and in contrast with a technique that uses only symmetrical basic type marks with one, geometrically-centered mark, multiple marks per geometry are permitted, and the multiple marks may be of different types. These are taken into account in the calculation of the mark coordinates in the mark placement step.

Figure 8:
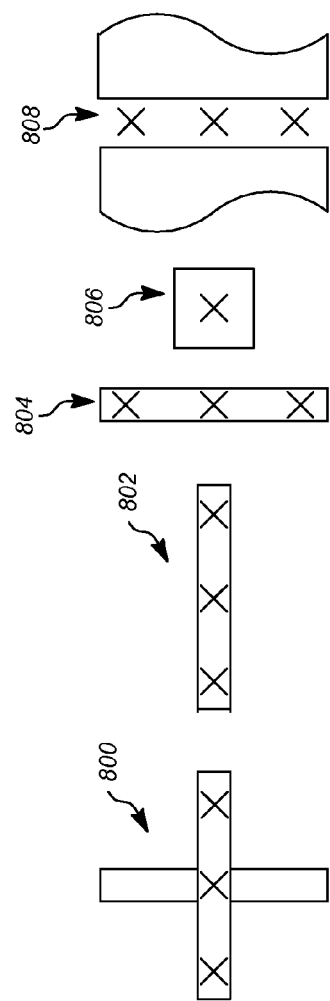
FIG. 8 is a series of diagrams illustrating multiple marks on symmetrical features in accordance with the teachings herein.

First, the concept of multiple marks is described with reference to FIG. 8. FIG. 8 is a series of diagrams illustrating multiple marks on symmetrical features in accordance with the teachings herein. To permit multiple marks of different types to be placed on each feature of interest, a record is kept with each pattern definition that describes what mark type is placed where on the match locations. For example, FIG. 8 shows a cross pattern 800 with a centered CD and multiple CDs on the arms, a horizontal bar 802 with a centered CD and multiple CDs on the ends, a vertical bar with a centered CD and multiple CDs on the ends, a box 804 and a reversed CD 806 with a centered CD in the space and multiple CDs at the ends of the space. The letter X in the figure represents the placement of the marks, and the term CD used therewith refers to the desire that the mark be equal to the critical dimension CD.

The position of each mark over the geometry is defined by an offset from an anchorpoint on the template of the pattern definition. There are nine typical bounding box anchorpoints: left-bottom, center-bottom, right-bottom, left-center, center, right-center, left-top, center-top and right-top. For symmetrical geometries, where the pattern matches in multiple orientations, the match orientation used is the minimum, which provides a relatively simple calculation of the coordinates of one or more marks within a match location since no reorientation is required.

This is in contrast with asymmetrical geometries. FIG. 9 is a diagram of multiple marks on a series of asymmetrical features showing orientation matching in accordance with the teachings herein. Each of patterns 902A, 904A and 906A are found at two respective match locations in a jobdeck 900. Pattern 902A is found at match locations 902B, 902C in two different orientations (see FIG. 7). Similarly, pattern 904A is found at match locations 904B, 904C in two different orientations, and pattern 906A is found at match locations 906B, 906C in two different orientations. As can be seen from FIG. 9, when one or more marks X are associated with an asymmetrical feature, the marks are re-orientated to the match location in the jobdeck 900, so that the positions of the marks relative to the underlying geometry of the pattern (such as patterns 902A, 904A, 906A) are maintained.

Re-orientation is discussed in additional detail below with respect to the calculation of marking coordinates in the mark placement step. First, however, the reduction of locations is discussed.

In practice, the use of a random global reduction of match locations has been shown to produce results that could be distributed across the jobdeck area in a less-than-optimal fashion. In general, it is desirable to have marks distributed more or less evenly if possible so as to avoid having some areas with a high number of marks while other areas have a low number of marks. One way to do this reduction is to randomly choose a location from those available and remove that location, randomly select another location and remove it, etc., until the number of locations left is the desired reduction number. Improving the distribution of marks may be achieved by performing the same technique on a per block basis. This effectively imposes a maximum location density per block area. A block could correspond generally to a portion of a layer in a similar manner as the owning block, but could be larger or smaller.

Another possible method is to perform a reduction on per layer or per block basis, or on some other basis using a statistical spread (e.g., a Gaussian filter, uniform distribution function or similar). The exact method of reducing the locations is not critical to the teachings herein since the requirements will have a strong dependency on the final objective of the user, i.e., to what use the marks will be applied. The method described here to exemplify reduction is simply a randomized selection of a predefined number of locations for each block after reorienting the marks as needed. Any method that achieves reduction and satisfies the end user may be used, according to need and intent.

Once the number of locations has been reduced, the sorting step can proceed. The sorting process involves sorting the marks so that all locations of a particular mark type belonging to a particular template, on a particular jobdeck layer, can be processed as a group. The exact method of sorting is implementation specific. In general, an initial approach for sorting could use a jobdeck layer and assigned datatype as a sorting key. Each element to be sorted would have the sorting key, plus four coordinates (e.g., the bounding box of the match location). The resulting sorted elements assigned to each sorting key could then have the center coordinate only. An alternative approach would be similar except that the sorted elements would include additional information, such as the pattern ID and match orientation. In one implementation, the sorting process may be a reordering process that includes but a group of data items such as layer, matching box coordinates, match pattern ID (datatype), match orientation, among which is the ordering key (e.g., a layer, datatype pair). Thus, the reordering may simply group the marks by the ordering key for group processing. Note that although the reduction of mark locations is described as being performed before this sorting process, reduction could occur after sorting/reordering or both before and after sorting/reordering. Another method could add the locations to a database and use database queries instead of direct sorting as above to define processing groups.

Mark Placement

The first step of the mark placement process is the calculation of the marking coordinates. Since arbitrary features can be marked, and a feature can have multiple marks, the geometry no longer necessarily equates to the mark type. Additionally, asymmetrical features are relevant, which means that the calculation of the final coordinates where marks are to be placed is no longer unique per location, but must also be oriented to the same orientation at which the match location is found. The following equations describe how the mark location is altered to adapt to detected orientation of the pattern for each of the orientations shown in FIG. 7:

$(xoo, yoo)_{0°} = (xo, yo)$
$(xoo, yoo)_{90°} = (-yo, xo)$
$(xoo, yoo)_{180°} = (-yo, -xo)$
$(xoo, yoo)_{270°} = (yo, -xo)$
$(xoo, yoo)_{M0°} = (xo, -yo)$
$(xoo, yoo)_{M45°} = (yo, xo)$
$(xoo, yoo)_{M90°} = (-xo, yo)$
$(xoo, yoo)_{M135°} = (-xo, -yo)$ In other words, if a location is found at an orientation of 90°, for example, then the mark offsets to be placed on that feature must also be oriented at 90° so that the relative positions to the underlying geometry are maintained. The resulting coordinates are called oriented offset coordinates.

The above offset equations assume that the original mark coordinates have as the anchor point the center of the template. For anchor points other than the center, variations of the equations may be used where the different anchor point location (bottom-left, bottom-center, bottom-right, left-center, right-center, left-top, center-top, right-top) is taken into account.

After the oriented offset coordinates for a mark to be placed have been calculated, the final mark coordinates (xm, ym) can be obtained by the use of the following two equations:

$$(xc, yc) = \left(\frac{xr + xl}{2}, \frac{yt + yb}{2}\right); \text{ and}$$

(xm, ym)=(xc+xoo, yc+yoo); wherein
(xc, yc) is a center point of the block in which the mark is located (e.g., the center of the bounding box of the match location);
xoo represents the x-oriented offset coordinate based on the detected orientation; and
yoo represents the y-oriented offset coordinate based on the detected orientation.

The calculation is performed for all marks to be placed on a location, for all locations found and for all templates (e.g., in three nested processing loops). The resulting mark coordinates are in jobdeck space and are suitable for the mark placement process.

After the mark coordinates have been calculated for all classified mark locations, for all marks on each location, including mark orientation, the mark placement process continues. Attached to each mark are mark options. These mark options, specific to each mark placed on each template, are set up individually together with the mark placement. Some options could be set up just before placing the mark, some options are part of the mark placement itself, and some options could be setup after the mark placement. Each mark is placed with its own specific options if any are specified. The exact order is not relevant. The end result is a jobdeck that contains all information of the marks placed, and is suitable for translation into metrology files to be used by optical tools. If post processing of the mark information were desired, such as to perform a last minute adjustment of mark parameters, having the information of where each mark originated is useful, and allows for backtracking through the automatic marking process. Each mark may therefore be saved with a tag, which contains a mark name unique within a location, the mark template name (i.e., the ID of the pattern definition that described the underlying geometry), and possibly the orientation information for the matched location. This allows associating each mark to its originating pattern definition even after all the processing is finished.

Marking may be explained in a bit more detail by referring to the data input from the classification step. More particularly, the classification step has yielded a (e.g., reduced) set of locations that are transformed from ordered location. The output has the following information:
1. Layer;
2. Datatype (matched pattern ID); and
3. Mark coordinates, represented by a reduced list of (xm, ym) coordinate pairs.

The classification step passes this array of mark coordinates to a second process of mark placement. This process for mark placement may be a simple triply-nested loop over the array of coordinates that resulted from the classification step, followed by a write out of the jobdeck with the marks. If the final objective of the mark placement were for a metrology tool, the metrology information file could at this point be written out as well.

The following pseudocode demonstrates the placement logic.

```
Foreach template in classified_results {
    foreach location in template {
        foreach mark in location {
            L = getlayer(template)
            marktype = getmarktype (mark)
            options = getmarkoptions(mark)
            Cm = getmarkcoordinates(mark)
            placemark(L, marktype, Cm, options)
        }
    }
}
writejobdeck( )
```

In this placement logic, template refers to one pattern description (although many could be processed in together). In certain implementations, there is an association between the template (i.e., the pattern definition) and a layer as a datatype pair (and not between the mark type and layer as a datatype pair). This is conceptually described as the decoupling of the geometry and the marktype. Location refers to one place found on the jobdeck where the geometry matches the template, and mark refers to one mark on that location.

Note that the exact mechanism of mark placement is not limited, and is implementation specific. The pseudocode shown above is one possibility. Another possibility is to place the marks in a distributed manner, by employing a cluster of computers running separate mark placement processes, each placing marks within its own window of the jobdeck In yet another implementation, the following pseudocode may demonstrate the placement logic. In this code, the use of "dopick" is meant to convey the use of automatic chip selection, based on the information already available, and the routine writejobdeck( ) writes the placed marks to the jobdeck.

```
foreach laydat in marks {
    foreach coord in marks(laydat) {
        L=getlayer(laydat)
        D=getdatatype(laydat)
        marktype=getmarktype(D)
        options=getmarkoptions(marktype)
        Xm=getXm(coord)
        Ym=getYm(coord)
        placemark(L, marktype, Xm, Ym, options)
    }
}
writejobdeck( )
```

In the above code, it is assumed that all mark coordinates for all locations for all templates have already been calculated, including orientation. This should have been done as the very first step in this mark placement process.

As explained in previous sections, this work generalizes the concept of marking geometry by decoupling the mark type from the shape of the geometry to be marked. Marking features that equate with the geometry type is considered a specific case, which means that marking of symmetrical geometries with single basic mark types (such as cross, bar, or box) is still possible. Because orientation information is now used, asymmetrical geometries can now also be marked with single asymmetrical basic mark types (such as L or 2-line). This is the first step towards the generalization of arbitrary geometry marking.

Figure 10:
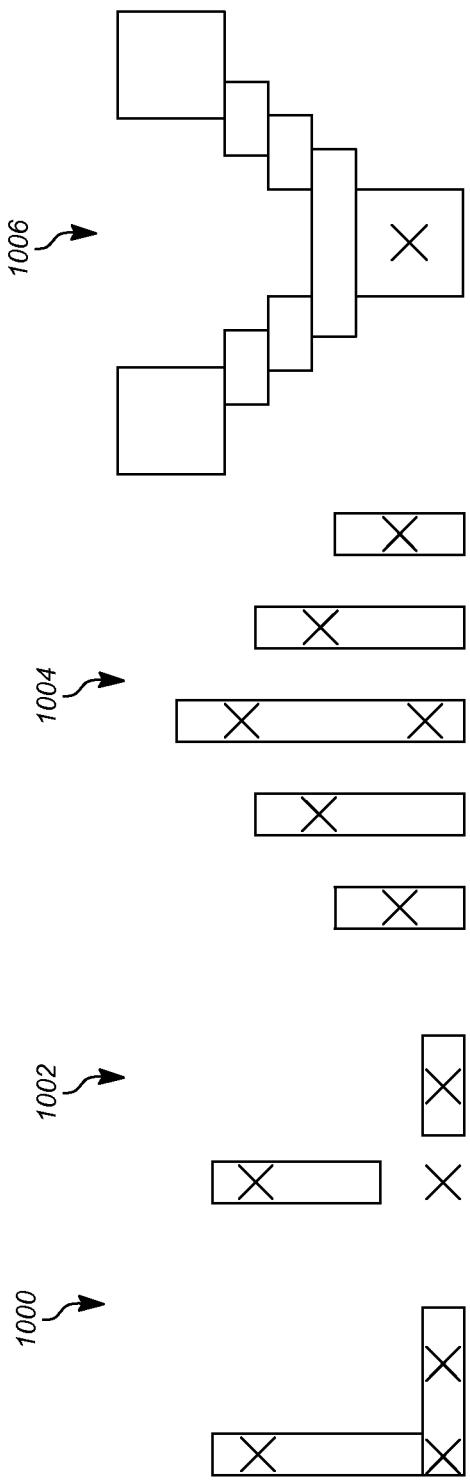
FIG. 10 is a series of diagrams illustrating basic asymmetrical mark types, arbitrary geometry with multiple marks and arbitrary area measurement (AAM) that can be used in accordance with the teachings herein.

The second step of generalization is that each geometrical feature can be marked with multiple marks, either of basic types or of a CD type. The third and final step of generalization is that of arbitrary geometry, which means that any feature that can be described by a pattern definition, either single polygon or a group of polygons, can have marks placed at specific positions. FIG. 10 is a series of diagrams illustrating basic asymmetrical mark types, arbitrary geometry with multiple marks and arbitrary area measurement (AAM) that can be used in accordance with the teachings herein. The concept of arbitrary geometry marking (AGM) as a generalization of mark typing herein has as consequence that advanced mark types can be searched for and placed. A first pattern 1000 shows an asymmetrical mark type in the form of an L with a CD at the corner and multiple CDs on the arms, while a second pattern 1002 shows an asymmetrical mark type in the form of two lines with a CD at the corner and multiple CDs on the arms. Arbitrary geometry in the form of a dense line group with multiple CDs on each line form another patter 1004 in FIG. 10. One example of advanced mark type is AAM as shown in FIG. 10, which is an arbitrary polygon mark type whose pattern 1006 may be used to measure both CD and the area of arbitrarily shaped polygons without holes.

While the processing described herein is not limited to use in any single system that transcribes design data into machine-readable instructions for mask production, it is particularly beneficial with the CATS® system available from Synopsys, Inc. Jobdeck MRC (JD MRC) is a single-level hierarchical processing function for a jobdeck available within that system. Accordingly, the marking process is described in more detail with reference to JD MRC.

Figure 11A:
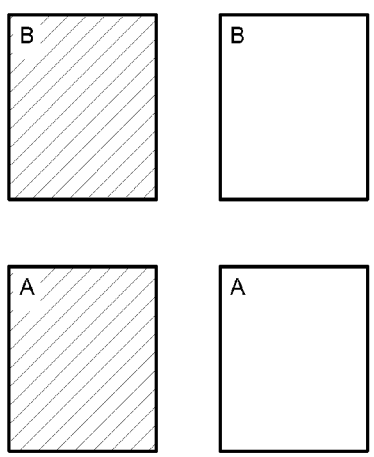
FIGS. 11A-11D are diagrams of processing modes that can be used marking a semiconductor in accordance with the teachings herein.
Figure 11B:
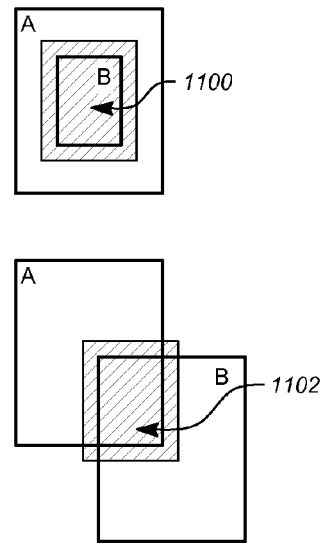
Figure 11C:
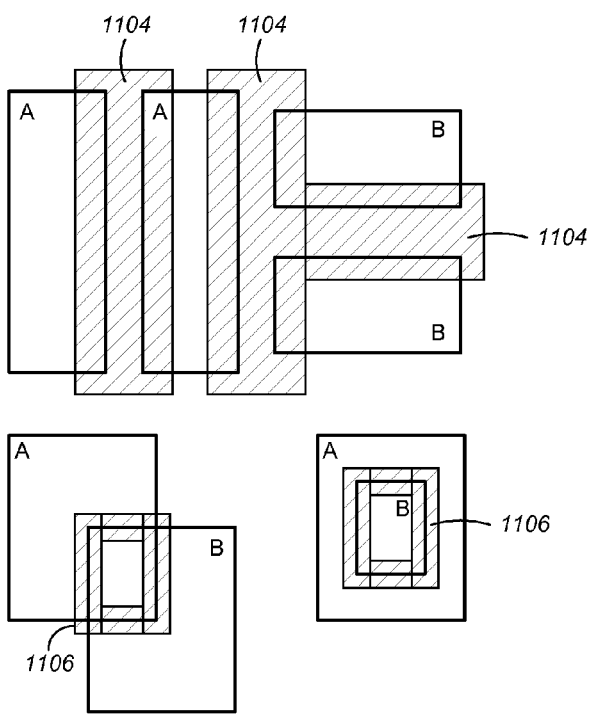
Figure 11D:
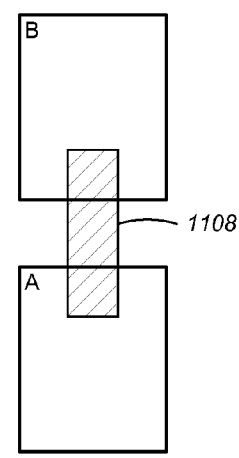

FIGS. 11A-11D are diagrams of processing modes that can be used marking a semiconductor in accordance with the teachings herein. There are four different processing modes, which can be combined or even repeated with different parameters. FIG. 11A shows a CHIP processing mode, FIG. 11B shows a CHIP_OVERLAP processing mode, FIG. 11C shows a CHIP_INTERACT processing mode, and FIG. 11D shows an Area processing mode.

These processing modes represent three processing concepts. The first concept is by-chip processing, represented by FIG. 11A, in which each chip is individually processed. Because this looks only at individual chips, and not at how the chips interact with each other, the second concept spans two additional possibilities shown in FIG. 11B that cover possible chip to chip interactions. The third concept is represented by FIGS. 11C and 11D and represents processing specific areas that are user defined.

In CHIP mode, the first instance of each chip in the jobdeck is processed with a command set generated in accordance with the teachings herein, and the results are arrayed over all chip placements A or B individually. Because each chip is processed only once, this contrasts with typical jobdeck processing, where all data is flattened, and all instances of all chips are processed by extension. As a result, the processing time is improved.

CHIP_OVERLAP mode of FIG. 11B handles areas 1100, 1102 of the jobdeck where there are overlaps between chip placements A and B. This is particularly useful when processing a chip together with the interactions with the frame that surrounds it.

CHIP_INTERACT mode looks at all areas 1104 where chip placements A and B are close to each other, or touching, as well as the areas 1106 that surround an overlapping area. If only the interactions between chip placements need to be processed, this mode is particularly useful to reduce processing time.

All three modes described above process only one area, and the results are arrayed over all other areas that are equivalent, thereby reducing processing time. In addition, AREA mode allows for additional processing of specific user defined areas, such as area 1108, in a jobdeck.

The automatic marking process described until this point details the searching for pattern definitions across the entire jobdeck. This means that every chip instance is searched by brute force in order to find all marking locations. In this example implementation, JD MRC can use RPM to search the jobdeck for marking locations because JD MRC can apply any manufacturing rules check and correct (MRCC) command set within each jobdeck area to be processed and because RPM is implemented within MRCC. When this is combined with the ability of JD MRC to define the areas to process as one instance for each chip by using CHIP mode, the result is that the automatic marking process described in this work can be applied per chip, and the resulting locations arrayed by using the chip instance information.

Figure 12:
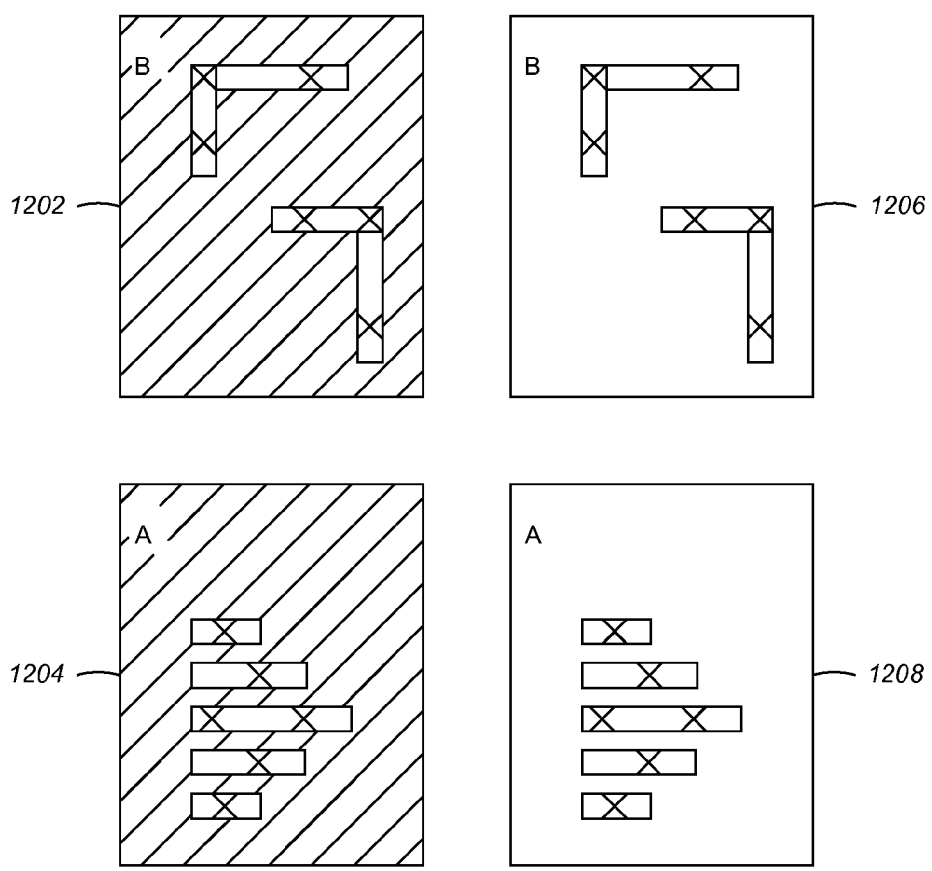
FIG. 12 is a diagram showing pattern matching of manufacturing rule checking (MRC) using a chip mode in accordance with one implementation of the teachings herein.

FIG. 12 is a diagram showing pattern matching of jobdeck manufacturing rule checking (MRC) using a chip mode in accordance with one implementation of the teachings herein. Matched patterns and their associated marks are shown for two chips 1202, 1204 in mask data 1200. The marks can be applied to other chips 1206, 1208 of mask data 1200, respectively, without repeating the processes described herein by using CHIP mode described above.

The above description works well for pattern generation and pattern matching of a small area geometry, i.e., when a geometric feature to be searched for and matched is relatively small. A geometric feature may be considered small, for example, when its largest dimension, e.g., height or width, is no more than about 5 µm, or not more than 10 µm at a resolution of 0.001 µm. For a specific resolution, however, the larger the area of the geometry to search in range pattern matching, the larger the required computational power. The needed level of computational power can increase exponentially with the larger dimensions of a large area geometry. Therefore, a unique technique to identify and search for large area geometry patterns, in addition to the search for small area geometries described above, is desirable for semiconductor fabrication processes, such as the marking described above and others where a pattern match is a step in the overall processing of an IC.

Searching for a geometry, or pattern matching in general, implies a description that identifies the geometry of interest. While the description must identify the geometry as uniquely as possible, it does not necessarily mean that it must describe all of it, but rather only those parts that fully identify the shapes. In other words, the geometry must be as simple as possible, in addition to being as unique as possible. In a sense, a description is a signature for the geometry of interest. Describing those parts of the desired geometry that make it unique means that a description can be a composition of those parts that identify the geometry. Each part can then be described individually with a pattern definition, thereby making it a subpattern. For example, the geometries found in the pattern matching above described previously may define subpatterns of a larger pattern. The spatial relationship between the subpatterns forming the larger pattern can also be described with a pattern definition. Together, the subpattern bounding boxes and spatial relationship definition define a description for the larger pattern. Herein, the larger pattern is called a superpattern, or metapattern, so the description is referred to as a metapattern definition herein.

Large area searching can then be accomplished by first searching on the full input data for all locations that match the subpattern descriptions, and then searching on the location results for all metalocations that match the metapattern definitions. Large area matching is therefore a two-step process, where the first is done in detail at working resolution, and the second is done at a coarse resolution to simplify the metapattern complexity.

This process is described in additional detail with reference to FIGS. 13-17.

Metapattern Description

Figure 13:
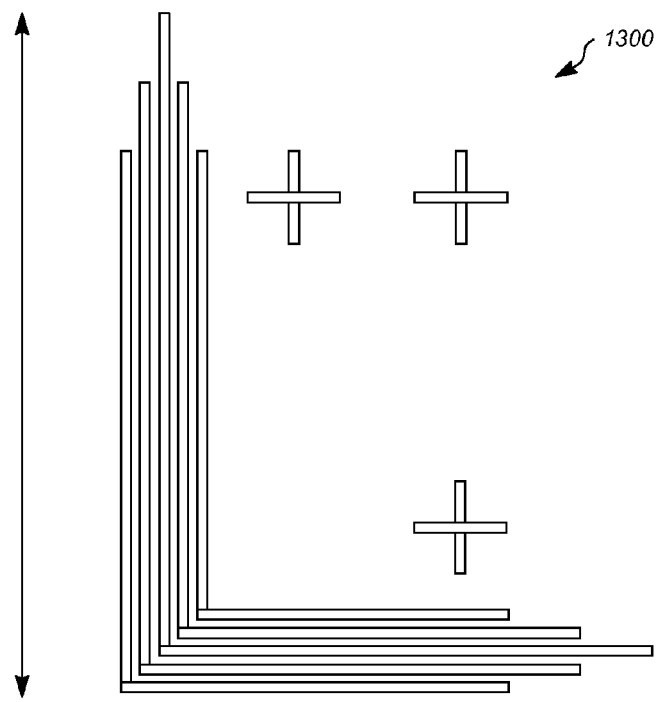
FIG. 13 is a diagram of a large area geometry to be described according to the teachings herein.

Referring first to FIG. 13, shown is a geometric shape or geometry 1300 with a size (e.g., a largest X- or Y-dimension) of 500 µm. At a resolution of one nm, the total size in resolution units is 500000, which is considered to be a large area geometry. Thus, large area geometry 1300 is desirably described by and searched using a metapattern definition.

Figure 14A:
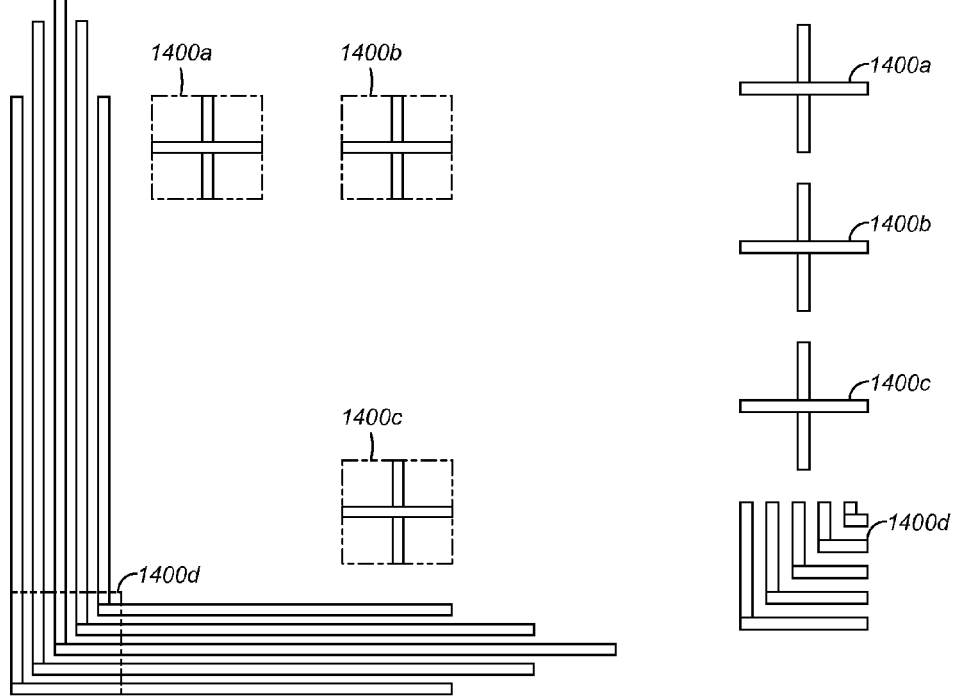
FIG. 14A is a diagram of the large area geometry of FIG. 13 showing its breakdown into subpatterns.
Figure 14B:
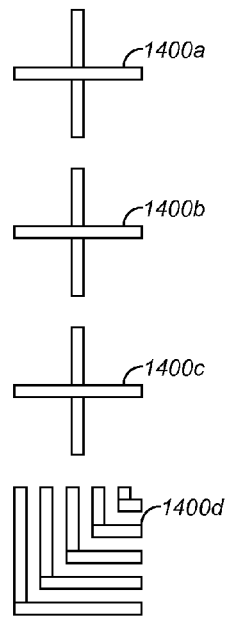
FIG. 14B is a diagram of the subpatterns of FIG. 14A.

The metapattern definition begins with breaking the geometry down by choosing the subpatterns that would need to be individually matched in order for the large area geometry to be found in the mask data. One way of accomplishing the breakdown of large area geometry 1300 of FIG. 13 is shown in FIGS. 14A and 14B. As can be seen therein, the breakdown includes four subpatterns: three crosses 1400a, 1400b and 1400c, and one stack 1400d of corners. Each of these may be described individually, resulting in four subpatterns, as shown in the enlarged view of FIG. 14B. Since crosses 1400a, 1400b, 1400c are identical in this example, it is also possible to define a single subpattern for them and then use that subpattern three times.

The second step in describing a metapattern is to describe the spatial relationships between the subpatterns, which creates the metapattern definition. This is done by using the subpattern locations, or bounding boxes, as the geometry for the description. Referring to FIG. 15A, each of the subpatterns 1400a, 1400b, 1400c, 1400d is shown with its respective bounding box 1500a, 1500b, 1500c, 1500d overlaid on large area geometry 1300. FIG. 15B shows the spatial relationships between the subpatterns—that is, the metapattern definition 1502. Metapattern definition 1502, like the general case, has a number of descriptions resulting from one description for each subpattern plus one description (e.g., the spatial relationships) for the metapattern. In this example, the total number of descriptions is five.

Metapattern Search

Figure 16:
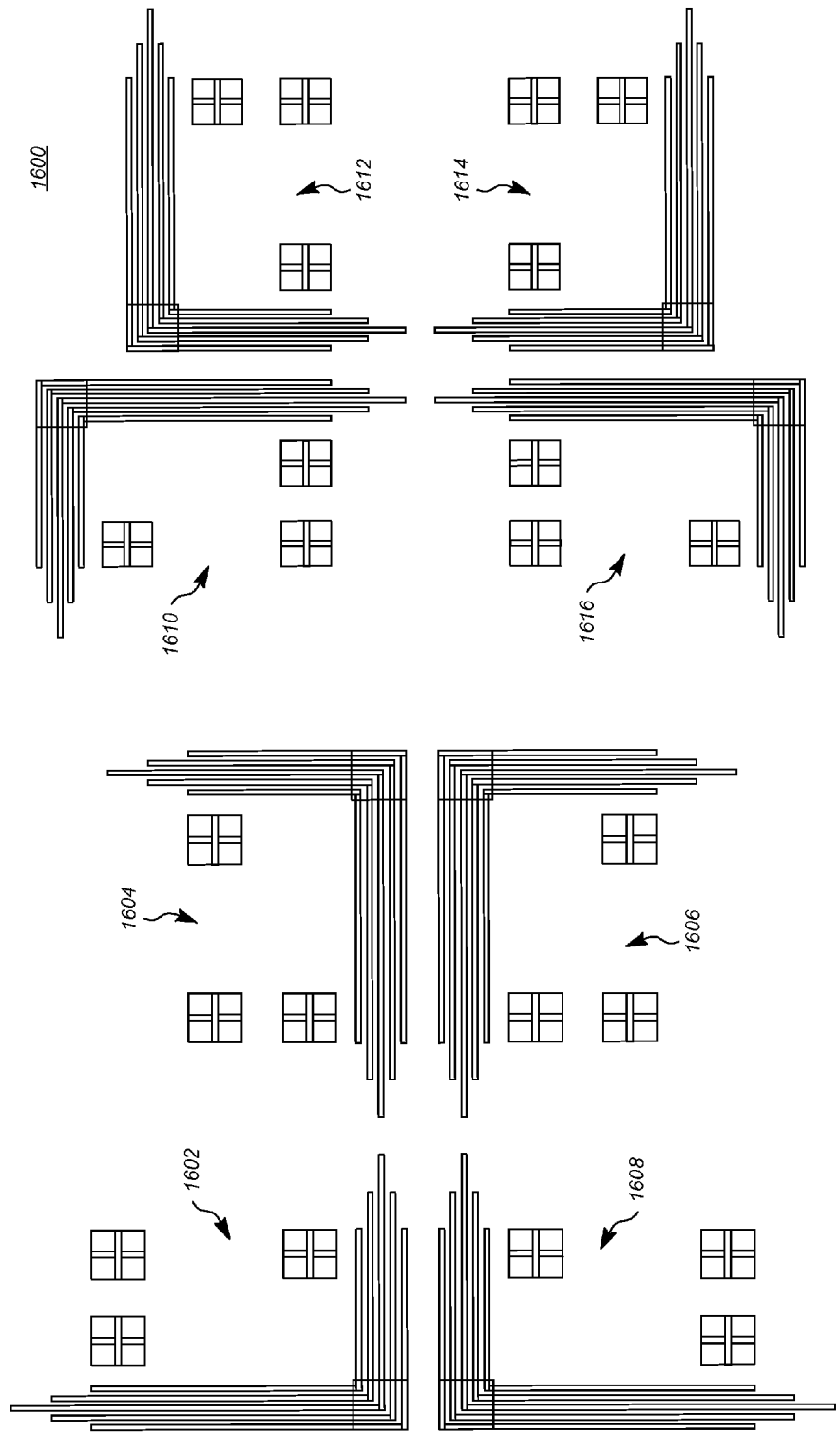
FIG. 16 is a diagram of mask data including geometries corresponding to the orientations at which the metapattern definition of FIG. 15B can be matched that also illustrates the results of searching for the subpatterns of FIG. 14B.

Once the metapattern is described, a two-step search process occurs in a similar manner as the metapattern description. The first step is to search for all relevant subpatterns across the input data. FIG. 16 shows all eight possible orientations 1602-1616 for metapattern definition 1502 over input data 1600 (e.g., the entirety of FIG. 16). In FIG. 16, the results of searching for the subpattern bounding boxes for subpatterns 1400a, 1400b, 1400c, 1400d over the mask input data 1600 including the eight orientations are shown.

Figure 17:
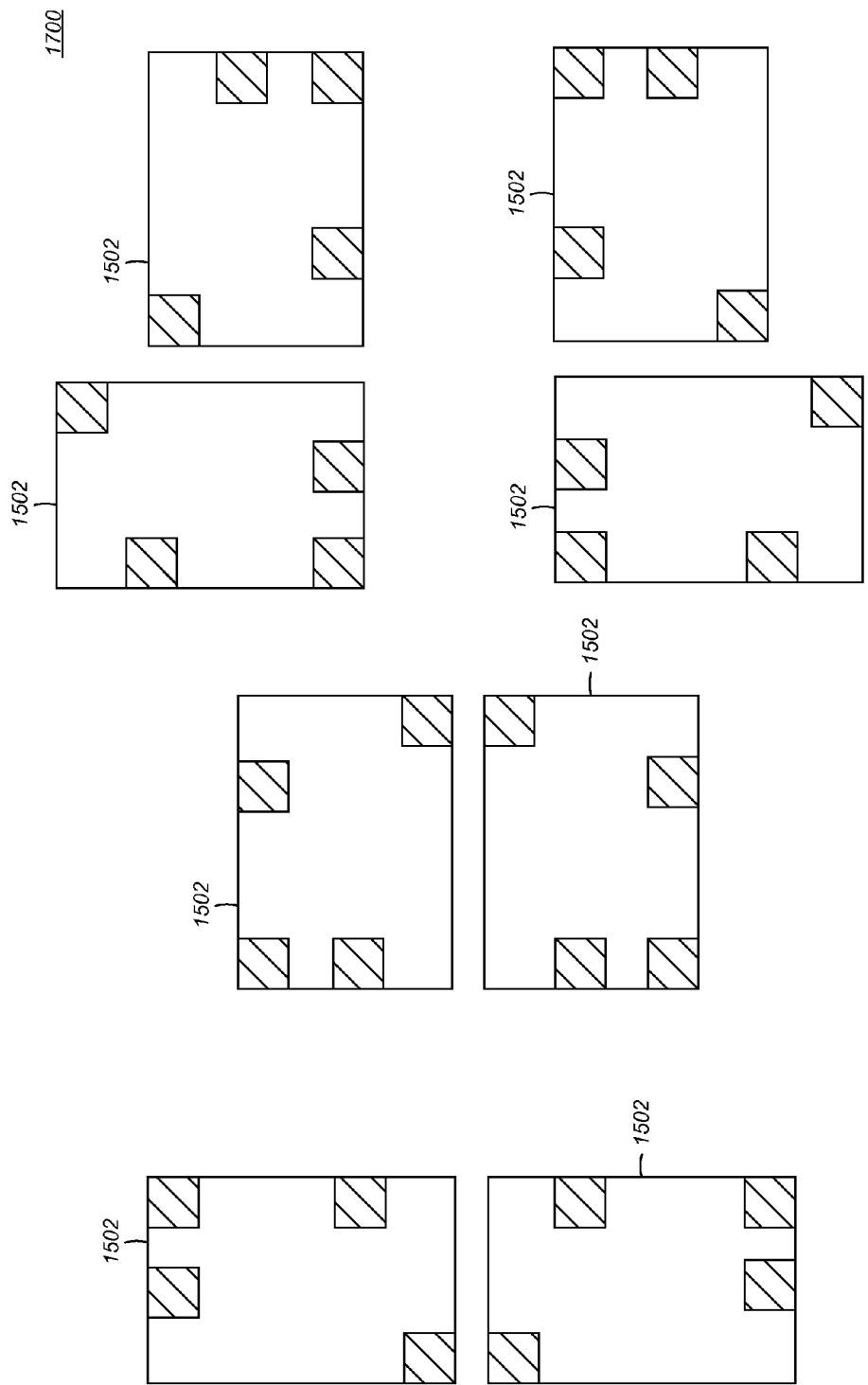
FIG. 17 is a diagram of the mask data of FIG. 16 illustrating the results of searching for the metapattern definition of FIG. 15B using the matched subpatterns of FIG. 16.

The second step of searching for the metapattern is to search for the metapattern over the subpattern results to check that the spatial relationships correspond to the metapattern definition. The result of this step is shown in FIG. 17. That is, FIG. 17 shows the results 1700 of searching for metapattern definition 1502 over the subpattern search results of FIG. 16. In order to simplify the computational requirements, this second step of "metamatching" may be done at a coarser resolution. Doing so allows the size in resolution units of the large area metapattern to be made comparable to the size of the subpatterns, speeding the search for the metapattern without a significant increase in computational requirements.

The metapattern description and search described above provide a robust process for large area searching that finds all locations that meet the spatial relationships of the subpattern locations. However, there are several considerations that, without more, would limit the use of the search results for certain other processes, such as marking. For example, the metasearch output results from matching the shapes and spatial relationships of the subpattern locations, without regard to the subpattern match information. Therefore, if a square subpattern is in a different orientation, but in the correct position, a false positive match will result from the metapattern search. This can be seen by reference to the example large area geometry 1300 in FIG. 14A. Subpattern 1400d has right angles formed by lines extending from the top of the square bounding box and lines extending to the right side of its square bounding box relative to subpatterns 1400a, 1400b and 1400c. If subpatterns 1400a, 1400b, 1400c and 1400d are all found, a metamatch would be identified. This means that a false positive would result if subpattern 1400d were rotated relative to subpatterns 1400a, 1400b and 1400c.

Another concern would be the matching of an external pattern at a location where a subpattern has the same shape. This arises because, once subpatterns are found, the metapattern search looks to the spatial relationships of the metapattern definition, not the content of the subpatterns themselves. For example, if subpattern 1400a were also found at the location of subpattern 1400d, the metapattern search would result in a false positive match for large area geometry 1300.

Resolution is also a concern. More specifically, the metapattern search is desirably done at a coarser resolution than the subpattern search to reduce computational load. This means that the metapattern locations are placed on a data grid that is coarser than the subpattern locations. This may result in metapattern locations that do not correctly align over the subpattern locations, preventing a match where one exists.

Figure 18:
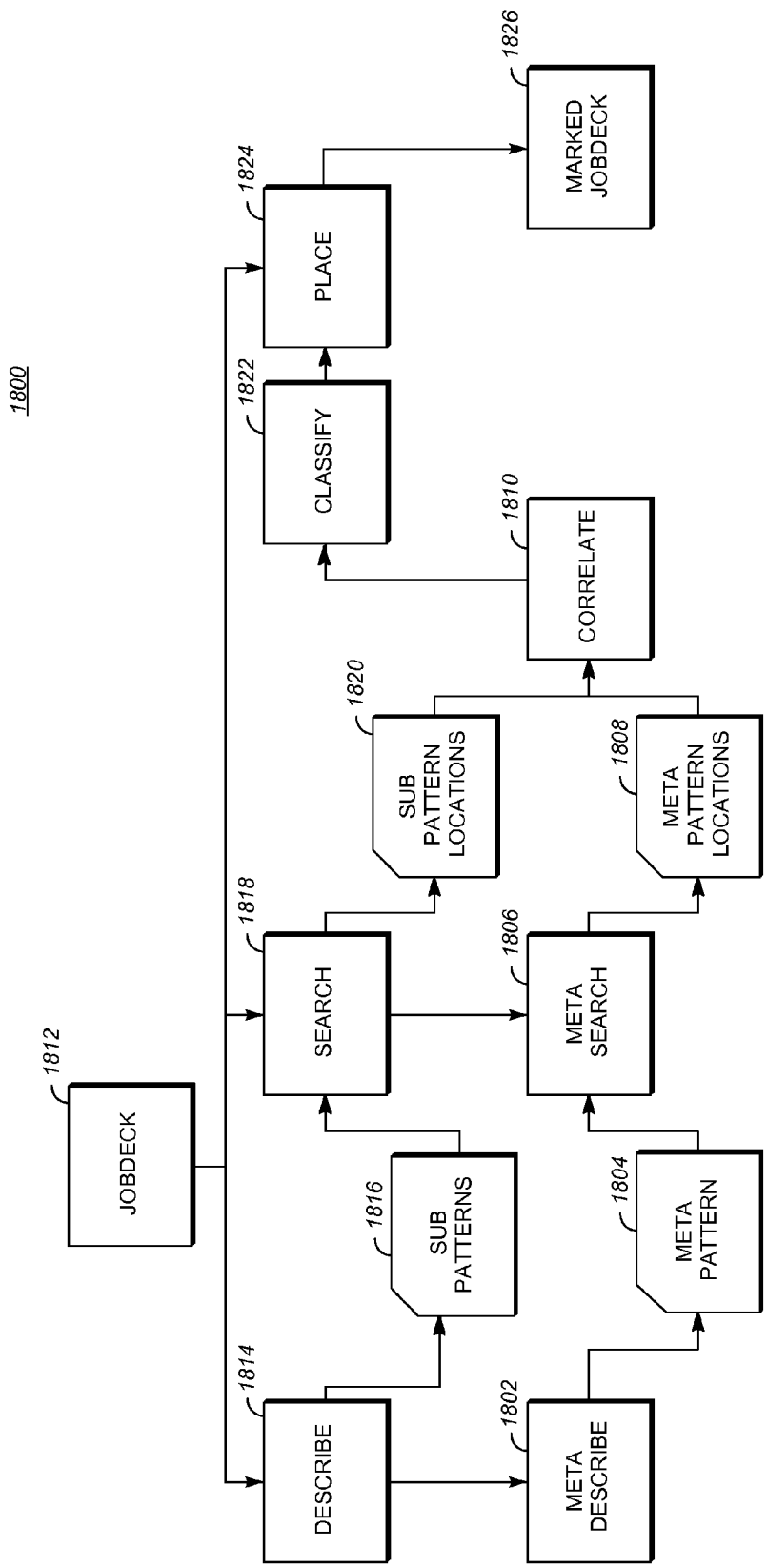
FIG. 18 is a diagram of an alternative process for marking semiconductor masks in accordance with the teachings herein.

FIG. 18 is a diagram of an alternative process 1800 for marking semiconductor masks than process 100 described in FIG. 1. Process 1800 is similar to process 100 except for the addition of several steps effective when searching for at least one large area geometry is required. The first addition in process 1800 is a metapattern description step 1802 that results in a metapattern definition 1804 for one or more metapatterns. The metapattern description 1802 is related to the pattern generation of FIG. 1. First, one or more layers of a jobdeck 1812 may be used to select geometric figures to describe in step 1814 for the production of subpattern descriptions or definitions in step 1816. This is similar to steps 102 and 104 is process 100 described with respect to FIG. 1. The subpattern definitions generated in step 1816 may be included in one or more libraries, such as the exact pattern library or ranged pattern library described with respect to FIG. 5. The metapattern description step 1802 is as described above—generating a metapattern description or definition 1804 based on the spatial relationships between the subpatterns that form the metapattern. The metapattern definition 1804 could include offsets between the same points on each bounding box of a subpattern, such as the top left corners of the bounding boxes and may be stored in a pattern library.

The second addition in process 1800 is a metapattern match search step 1806 that results in the matching locations 1808 for the metapattern(s). The metapattern match search step 1806 uses input from a search step 1812 for pattern matching that results in matching locations for patterns similar to those in step 106 of FIG. 1. Those matching locations are used as the input into metapattern search step 1806 as described with respect to FIG. 16.

The third, and final, addition in process 1800 is a correlation step 1810 correlating the metapattern locations 1808 and the subpattern locations 1802 that addresses the problems with the metapattern search described above.

A first correlation of correlation step 1810 addresses orientation. The match information 1808 includes all orientations at which a pattern matched. In the example in FIG. 16, the three crosses all match at all eight orientations, while the stack of corners matches only at a single orientation at each location. The metapattern also matches at only a single orientation at each location. The correlation for orientation compares the subpattern orientations of the subpattern locations 1820 that overlap with the metapattern location 1808 with the metapattern orientation. If all subpattern orientations coincide in at least one orientation with the metapattern orientations, then the metamatch location 1808 is kept for the classification step 1822. Referring to FIG. 16, a metamatch location 1808 of the possible matches based on metapattern search 1806 would remain as a metamatch location if the orientations of each of subpatterns 1400*a*, 1400*b*, 1400*c* and 1400*d* matched, whatever those orientations may be. For example, if the metapattern 1502 were rotated 90 degrees to make the match, and all subpatterns 1400*a*, 1400*b*, 1400*c* and 1400*d* were also rotated 90 degrees in the match, the metamatch location 1808 would be kept. If instead, subpattern 1400*d* were rotated 180 degrees, the metamatch location 1808 would be discarded.

A second correlation of correlation step 1810 involves the identification of subpatterns forming the match. To perform this correlation, it is desirable that the match information contains the pattern name at each location 1808. The metapattern definition, such as definition 1502, includes which subpatterns make up its composition. The correlation for subpatterns thus compares the names of the subpattern locations 1820 that overlap each metapattern location 1808. If any subpattern name that makes up the metapattern definition is missing, the metapattern location 1808 is discarded before the classification step 1822. For example, if a possible metapattern location 1808 corresponding to metapattern definition 1502 were found with four subpatterns corresponding to the name "cross" (e.g., 1400*a*, 1400*b*, 1400*c* and one additional cross subpattern), the metapattern location 1808 would not be kept as it would be missing "stepped corner" subpattern 1400*d*.

A third correlation of correlation step 1810 addresses problems that may result when metamatch locations 1808 are placed on a data grid that is coarser than the subpattern grid. If the previous two correlations pass a metamatch location 1808, that location may be adjusted to the tight bounding box of the subpattern locations 1820 that overlap it, thereby placing it on the same data grid as the subpatterns that make it up.

The output of correlation process 1810 is passed to the classification ("classify") step 1822, and the results of the classify step 1822 are passed to the marking ("place") step 1824, in a similar manner as described for steps 108 and 110 of process 100 above. A marked jobdeck 1826 results.

This description includes the feature that the jobdeck that is eventually marked is the input jobdeck used to generate the pattern descriptions or definitions. This is not required. The patterns, including the subpatterns and metapatterns, may be obtained from a set of sampled geometry data clips from other jobdecks or mask layers and stored for later use for the search, classification and place steps for one or several jobdecks.

Figure 19:
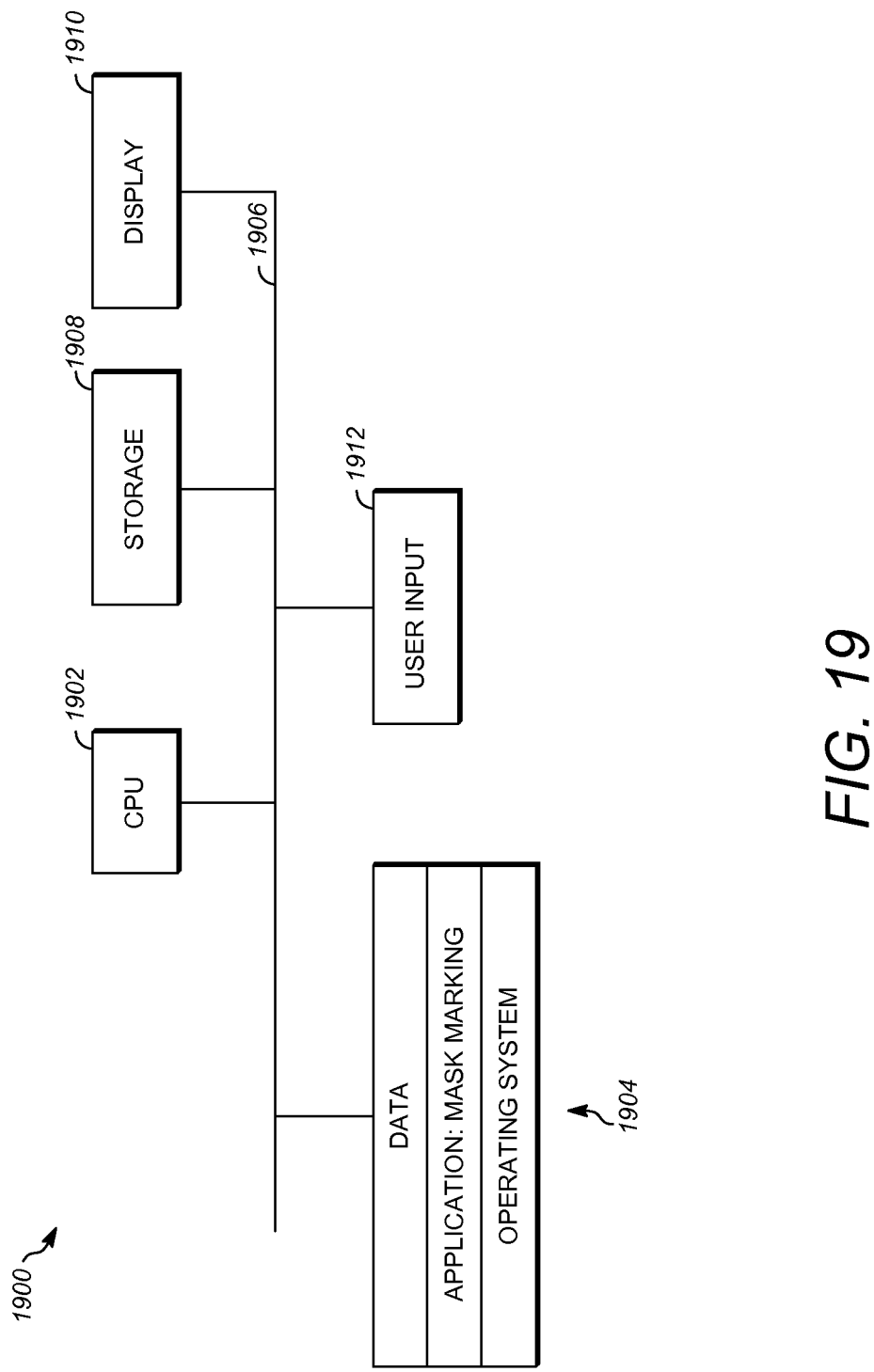
FIG. 19 is a diagram of a computing device in which the teachings herein may be incorporated.

FIG. 19 is a diagram of a computing device 1900 in which the teachings herein may be incorporated. Computing device 1900 can be in the form of a computing system including multiple computing devices, or in the form of a single computing device, for example, a mobile phone, a tablet computer, a laptop computer, a notebook computer, a desktop computer, and the like.

A CPU 1902 in computing device 1900 can be a conventional central processing unit. Alternatively, CPU 1902 can be any other type of device, or multiple devices, capable of manipulating or processing information now-existing or hereafter developed. Although the teachings herein can be practiced with a single processor as shown, e.g., CPU 1902, this is not required. More than one processor may be used. Unless otherwise noted herein, references to a processor may refer to one or more processors functioning together to perform the described processes or steps.

A memory 1904 in computing device 1900 may be a random access memory (RAM) device, but can be any other suitable type of storage device. Memory 1904 can include code and data that is accessed by CPU 1902 using a bus 1906. Memory 1904 can further include an operating system and one or more application programs. In this example, the application programs include at least one program that permits CPU 1902 to perform the mask marking described here. Computing device 1900 can also include a secondary storage 1908, which can, for example, be a disk drive.

Computing device 1900 can also include one or more peripheral devices, such as a display 1910. Display 1910 may be, in one example, a touch sensitive display that combines a display with a touch sensitive element that is operable to sense touch inputs. Display 1910 is coupled to CPU 1902 via bus 1906. When included, display 1910 can be implemented in various ways, including by a liquid crystal display (LCD), a cathode-ray tube (CRT) display or light emitting diode (LED) display, such as an OLED display. The touch sensitive element can be coupled to CPU 1902 via user input interface 1912 and bus 1906, for example. User input interface 1912 can also be used to couple a keyboard, a mouse or any other means of acquiring input from a user for processing using CPU 1902.

Although FIG. 1 depicts CPU 1902 and memory 1904 of computing device 1900 as being integrated into a single unit, other configurations can be utilized. The operations of CPU 1902 can be distributed across multiple machines (each machine having one or more of processors) that can be coupled directly or across a local area or other network. Memory 1904 can be distributed across multiple machines such as a network-based memory or memory in multiple machines performing the operations of computing device 1900. Although depicted here as a single bus, bus 1906 of computing device 1900 can be composed of multiple buses. Further, secondary storage 1908 can be directly coupled to the other components of computing device 1900 or can be accessed via a network and can comprise a single integrated unit such as a memory card or multiple units such as multiple memory cards. Computing device 1900 can thus be implemented in a wide variety of configurations. Data received and used by computing device 1900 may be received by CPU 1902 internally from memory 1904 or storage 1908 or may be received externally from other, related processes through bus 1906.

Implementations of computing device 1900 (and the algorithms, methods, instructions, etc., stored thereon and/or executed thereby as described herein) may be realized in hardware, software, or any combination thereof. The hardware can include, for example, computers, IP cores, ASICs, PLAs, optical processors, PLCs, microcode, microcontrollers, servers, microprocessors, digital signal processors or any other suitable circuit. In the claims, the term "processor" should be understood as encompassing any of the foregoing hardware or other like components to be developed, either singly or in combination.

In one example, computing device 1900 may be implemented using a general purpose computer or general purpose processor with a computer program that, when executed, carries out any of the respective methods, algorithms and/or instructions described herein. In addition or alternatively, for example, a special purpose computer/processor can be utilized which can contain other hardware for carrying out any of the methods, algorithms, or instructions described herein. Further, some or all of the teachings herein may take the form of a computer program product accessible from, for example, a tangible (i.e., non-transitory) computer-usable or computer-readable medium. A computer-usable or computer-readable medium is any device that can, for example, tangibly contain, store, communicate, or transport the program for use by or in connection with any processor. The medium may be an electronic, magnetic, optical, electromagnetic or semiconductor device, for example.

As described herein, the processes include a series of steps. Unless otherwise indicated, the steps described may be processed in different orders, including in parallel. Moreover, steps other than those described may be included in certain implementations, or described steps may be omitted or combined, and not depart from the teachings herein.

Note that the mask data, patterns, bounding boxes, marks, etc., shown in the figures are geometrical representations of data stored in a tangible, non-transitory medium (e.g., computer memory) for manipulation according to the teachings herein and may or may not also be included in other tangible formats, such as on paper.

While this disclosure includes certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus, comprising:
   memory; and
   a processor configured to execute instructions stored in the memory to:
   search mask data, wherein the mask data describes figures corresponding to features of an optical mask to be generated based on the mask data, and wherein the mask data is searched for a set of one or more figures corresponding with an electronic pattern definition, the pattern definition describing at least one geometric figure and having a pattern ID;
   identify a match in the mask data, wherein the match comprises a set of one or more figures corresponding with the pattern definition;
   identify a match location in the mask data, the mask location corresponding to a location of the match in the mask data;
   identify a match orientation, the match orientation describing an orientation of the match; and
   generate a set of coordinates for the match location based on the pattern ID and the match orientation, the set of coordinates indicating a position in the mask data for further processing.

2. The apparatus of claim 1 wherein the pattern definition includes one or more mark locations located with respect to the geometric figure; and wherein the set of coordinates comprises a set of mark coordinates indicating locations for placing one or more marks on the match.

3. The apparatus of claim 1 wherein the processor is configured to:
   generate the pattern definition, wherein the pattern definition is an exact pattern based on the at least one geometric figure.

4. The apparatus of claim 1 wherein the processor is configured to:
   generate the pattern definition, wherein the pattern definition is a range pattern based on the at least one geometric figure, the range pattern defining a range of values about the at least one geometric figure.

5. The apparatus of claim 4 wherein the range of values is of a fixed size about each edge of the at least one geometric figure.

6. The apparatus of claim 4 wherein the range of values for each edge of the at least one geometric feature is relative to a distance of the edge within the at least one geometric feature.

7. The apparatus of claim 1 wherein the processor is configured to:
   identify a plurality of geometry data clips in a data file divided into a plurality of blocks;
   create a respective bounding box for each of the plurality of geometry data clips;
   identify a geometry owning block for each of the plurality of geometry data clips as a block of the plurality of blocks containing a center of the respective bounding box; and
   generate a respective pattern definition for each data clip of the plurality of geometry data clips using the geometry owning block associated with each data clip, wherein the pattern definition is one of the respective pattern definitions.

8. The apparatus of claim 1 wherein the geometric figure has an asymmetrical shape, the pattern definition includes one or more mark locations located with respect to the at least one geometric figure, and a mark location of the one or more mark locations is offset from an anchorpoint on the template of the pattern definition.

9. The apparatus of claim 1 wherein the geometric figure has an asymmetrical shape, and the match orientation is one of eight available orientations of the pattern definition.

10. The apparatus of claim 1 wherein the processor is configured to identify the match location by:
    performing a first search of the mask data for pattern definitions for each data clip of a plurality of geometry data clips, an output of the first search being a plurality of identified match locations; and
    performing a second search of the mask data comparing the plurality of identified match locations to a spatial definition of a metapattern definition, the metapattern definition comprising at least two pattern definitions and the spatial definition between the at least two pattern definitions; and wherein an output of the second search includes the match location.

11. The apparatus of claim 10 wherein the processor is configured to perform the first search at a first resolution and to perform the second search at a second resolution, and the second resolution is a coarser resolution than the first resolution.

12. The apparatus of claim 10 wherein the output of the second search comprises at least one candidate location for the metapattern definition within the mask data where at least two identified match locations correspond to the spatial definition of the metapattern definition, and the processor is configured to:

correlate data of each candidate location with data of the at least two pattern definitions to determine which candidate location is the match location for the metapattern definition.

13. The apparatus of claim 12 wherein the processor is configured to correlate the data of each candidate location by:

comparing pattern IDs of the at least two pattern definitions to pattern IDs of the at least two identified match locations of the candidate location; and comparing match orientations of those of the at least two identified match locations of the candidate location to a match orientation of the candidate location; wherein the candidate location is the match location for the metapattern definition when:

the pattern IDs of the at least two pattern definitions match the pattern IDs of the at least two identified match locations; and the match orientations of the at least two identified match locations match the match orientation of the candidate location.

14. An apparatus, comprising:
memory; and
a processor configured to execute instructions stored in the memory to:

perform a first search of mask data, wherein the mask data describes figures corresponding to features of an optical mask to be generated based on the mask data, and wherein the first search comprises searching each data clip of a plurality of geometry data clips for a set of one or more figures corresponding with an electronic pattern definition, the pattern definition describing at least one geometric figure, an output of the first search being a plurality of identified match locations;

perform a second search of the mask data, wherein the second search comprises comparing the identified match locations to a spatial definition of a metapattern definition, the metapattern definition comprising at least two pattern definitions and the spatial definition between the at least two pattern definitions; wherein an output of the second search includes a match location in the mask data where the mask data matches the metapattern definition; and generate a set of coordinates for the match location, the set of coordinates indicating a position in the mask data for further processing.

15. The apparatus of claim 14 wherein the processor is configured to:
perform the first search at a first resolution; and
perform the second search at a second resolution; wherein the first resolution is a finer resolution than the second resolution.

16. The apparatus of claim 14 wherein each of the pattern definitions has a respective pattern ID, and the processor is configured to:

identify a match orientation of each of the pattern definitions within the plurality of identified match locations, wherein the set of coordinates is based on the pattern IDs and the match orientations.

17. The apparatus of claim 16 wherein the processor is configured to:

place the match location on a same data grid as the pattern definitions before generating the set of coordinates.

18. The apparatus of claim 14 wherein the output of the second search comprises at least one candidate location for the metapattern definition where at least two identified match locations match the spatial definition of the metapattern definition, and the processor is configured to:

compare pattern IDs of the at least two pattern definitions to pattern IDs of the at least two identified match locations of the candidate location; and compare match orientations of those of the at least two identified match locations of the candidate location to a match orientation of the candidate location; wherein the candidate location is the match location when:

the pattern IDs of the at least two pattern definitions match the pattern IDs of the at least two identified match locations; and the match orientations of the at least two identified match locations match the match orientation of the candidate location.

19. A non-transitory computer-readable storage medium storing instructions that, when executed by a processor, perform the steps of:

searching mask data, wherein the mask data describes figures corresponding to features of an optical mask to be generated based on the mask data, and wherein the mask data is searched for a set of one or more figures corresponding with an electronic pattern definition, the pattern definition describing at least one geometric figure and having a pattern ID;

identifying a match in the mask data, wherein the match comprises a set of one or more figures corresponding with the pattern definition;

identifying a match location in the mask data, the mask location corresponding to a location of the match in the mask data;

identifying a match orientation, the match orientation describing an orientation of the match; and generating a set of coordinates for the match location based on the pattern ID and the match orientation, the set of coordinates indicating a position in the mask data for further processing.

20. The non-transitory computer-readable storage medium of claim 19 wherein the pattern definition includes one or more mark locations located with respect to the geometric figure; and further comprising instructions that, when executed by the processor, perform the steps of:

generating, based on the match orientation, oriented offset components by orienting a mark offset for each of the one or more mark locations of the pattern definition relative to a location center of a block encompassing the match location; and calculating the set of coordinates by adding the oriented offset components to coordinates of the location center of the block, wherein the set of coordinates is a set of mark coordinates for placing the one or more marks at the match location.

21. The non-transitory computer-readable storage medium of claim 19, further comprising instructions that, when executed by the processor, perform the steps of:

identifying a plurality of geometry data clips in a data file, at least two of the plurality of data clips associated with a single geometry pattern, the single geometry pattern being a metapattern;

creating a respective bounding box for each of the plurality of geometry data clips;

generating a respective pattern definition for each data clip of the plurality of geometry data clips;

assigning each pattern definition a pattern ID;

for the bounding boxes of the at least two of the plurality of data clips associated with the metapattern, generating a spatial relationship with respect to each other; and forming a metapattern definition of the metapattern including the pattern definitions and the spatial relationship, the metapattern definition having a pattern ID.

* * * * *